(12) United States Patent
Choi et al.

(10) Patent No.: US 12,396,105 B2
(45) Date of Patent: Aug. 19, 2025

(54) DISPLAY DEVICE

(71) Applicant: Samsung Display Co., Ltd., Yongin-si (KR)

(72) Inventors: Dongwon Choi, Seoul (KR); Beomjin Kim, Asan-si (KR); Jin Hwan Choi, Seoul (KR); Jiyeon Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 74 days.

(21) Appl. No.: 17/939,410

(22) Filed: Sep. 7, 2022

(65) Prior Publication Data

US 2023/0180404 A1  Jun. 8, 2023

(30) Foreign Application Priority Data

Dec. 6, 2021  (KR) .......................... 10-2021-0173152

(51) Int. Cl.
*H05K 5/02* (2006.01)

(52) U.S. Cl.
CPC .................................. *H05K 5/0217* (2013.01)

(58) Field of Classification Search
CPC ............. H05K 5/0217; H04M 1/0235; H04M 1/0268; G06F 1/1652; G09F 9/301; H10K 59/12; H10K 59/871; H10K 50/841; H10K 77/111; H10K 2102/311
USPC ....................................................... 248/677
See application file for complete search history.

(56) References Cited

U.S. PATENT DOCUMENTS

| 9,940,892 | B2 | 4/2018 | Pang |
| 10,362,690 | B2 | 7/2019 | Han |
| 10,687,428 | B2 | 6/2020 | Kim et al. |
| 10,798,831 | B2 * | 10/2020 | Shin ................... H05K 5/0217 |

(Continued)

FOREIGN PATENT DOCUMENTS

| KR | 1020170095636 A | 8/2017 |
| KR | 1020190054427 A | 5/2019 |

(Continued)

OTHER PUBLICATIONS

Luan, et al., Design and Fabrication of Heterogeneous, Deformable Substrates for the Mechanically Guided 3D Assembly, ACS, Applied Material & Interfaces, 2019, 11, 3482-3492.

(Continued)

*Primary Examiner* — Muhammad Ijaz
(74) *Attorney, Agent, or Firm* — CANTOR COLBURN LLP

(57) ABSTRACT

A display device includes a display module, a support layer disposed below the display module, a support layer disposed below the display module, and including a rolling portion wound and unwound in a first direction, where the rolling portion includes a central portion, a first region between a first edge of the rolling portion and the central portion, and a second region between a second edge of the rolling portion and the central portion, a first support bar disposed in the central portion, second support bars disposed in the first region, and third support bars disposed in the second region. A width of each of the second support bars in the first direction is greater than a width of the first support bar, and widths of the second support bars in the first direction gradually increase as being closer to the first edge.

20 Claims, 18 Drawing Sheets

(56) References Cited

U.S. PATENT DOCUMENTS

| | | |
|---|---|---|
| 11,029,733 B2 | 6/2021 | Lee |
| 11,940,849 B2 | 3/2024 | Choi et al. |
| 2017/0262022 A1* | 9/2017 | Choi ................... G06F 1/1652 |
| 2017/0359910 A1* | 12/2017 | Seo ..................... H05K 5/0217 |
| 2019/0098776 A1* | 3/2019 | Jeon ................... H05K 5/0017 |
| 2019/0297736 A1* | 9/2019 | Xu ....................... G06F 1/1652 |
| 2021/0242420 A1* | 8/2021 | Luo ..................... H10K 77/111 |
| 2022/0262281 A1* | 8/2022 | Kim ....................... G09F 9/301 |
| 2022/0264754 A1* | 8/2022 | Kim ..................... G06F 1/1652 |
| 2022/0357775 A1* | 11/2022 | Choi ................... G06F 1/1652 |
| 2023/0030142 A1* | 2/2023 | Seo ........................ G09F 9/301 |
| 2023/0098597 A1* | 3/2023 | Gao .................... H05K 5/0217 |
| | | 361/807 |
| 2023/0180404 A1* | 6/2023 | Choi ....................... G09F 9/301 |
| | | 361/807 |
| 2023/0269890 A1* | 8/2023 | Choi ..................... G06F 1/1652 |
| | | 361/807 |
| 2023/0288955 A1* | 9/2023 | Park ..................... G06F 1/1652 |
| 2024/0130060 A1* | 4/2024 | Park ....................... H10K 59/87 |

FOREIGN PATENT DOCUMENTS

| | | |
|---|---|---|
| KR | 1020200030265 A | 3/2020 |
| KR | 1020200128319 A | 11/2020 |
| KR | 1020210014801 A | 2/2021 |
| KR | 1020210041665 A | 4/2021 |

OTHER PUBLICATIONS

Romeo, et al., Elastomeric substrates with embedded stiff platforms for stretchable electronics, AIP, Applied Physics Letters, 102, 131904-1-131904-5 (2013).

* cited by examiner

DISPLAY DEVICE

This application claims priority to Korean Patent Application No. 10-2021-0173152, filed on Dec. 6, 2021, and all the benefits accruing therefrom under 35 U.S.C. § 119, the content of which in its entirety is herein incorporated by reference.

BACKGROUND

1. Field

The disclosure herein relates to a display device.

2. Description of the Related Art

An electronic device which provides images to a user, such as a smart phone, a digital camera, a notebook computer, a navigation game, and a smart television, includes a display device for displaying the images. The display device generates images, and provides the images to a user through a display screen.

With the recent technology development of display devices, display devices of various shapes are being developed. For example, various flexible display devices which may be deformed into a shape having a curved surface, folded, or rolled are being developed. Flexible display devices are easy to carry around, and may improve user convenience.

SUMMARY

A rollable display device among flexible display devices may include a display module wound on a roller, and a support which supports the display module. When the display module is wound on a roller, stress may occur in the display module. Accordingly, it is desired to reduce such stress.

Embodiments of The disclosure provide a display device which may minimize defects of a display module by optimizing the strain and support force of a module support according to the positions of portions of the display module, and may improve the surface quality of the display module.

In an embodiment of the invention, a display device includes a display module, a support layer disposed below the display module, where the support layer includes a rolling portion wound and unwound in a first direction, where the rolling portion includes a central portion, a first region between a first edge of the rolling portion and the central portion, and a second region between a second edge of the rolling portion, which is opposite to the first edge in the first direction, and the central portion, a first support bar disposed in the central portion, a plurality of second support bars disposed in the first region, and a plurality of third support bars disposed in the second region. In such an embodiment, a width of each of the plurality of second support bars in the first direction is greater than a width of the first support bar, and widths of the plurality of second support bars in the first direction gradually increase as being closer to the first edge.

In an embodiment of the invention, a display device includes a display module, a support layer disposed below the display module, where the support layer includes a rolling portion wound and unwound in a first direction, and a plurality of support bars disposed in the support layer, where each of the plurality of support bars extends in a second direction crossing the first direction, and the plurality of support bars is arranged in the first direction. In such an embodiment, wherein widths of the plurality of support bars in the first direction gradually increase from one point of the rolling portion toward opposing ends of the rolling portion opposite to each other in the first direction, and the plurality of support bars is arranged at constant intervals in the first direction.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
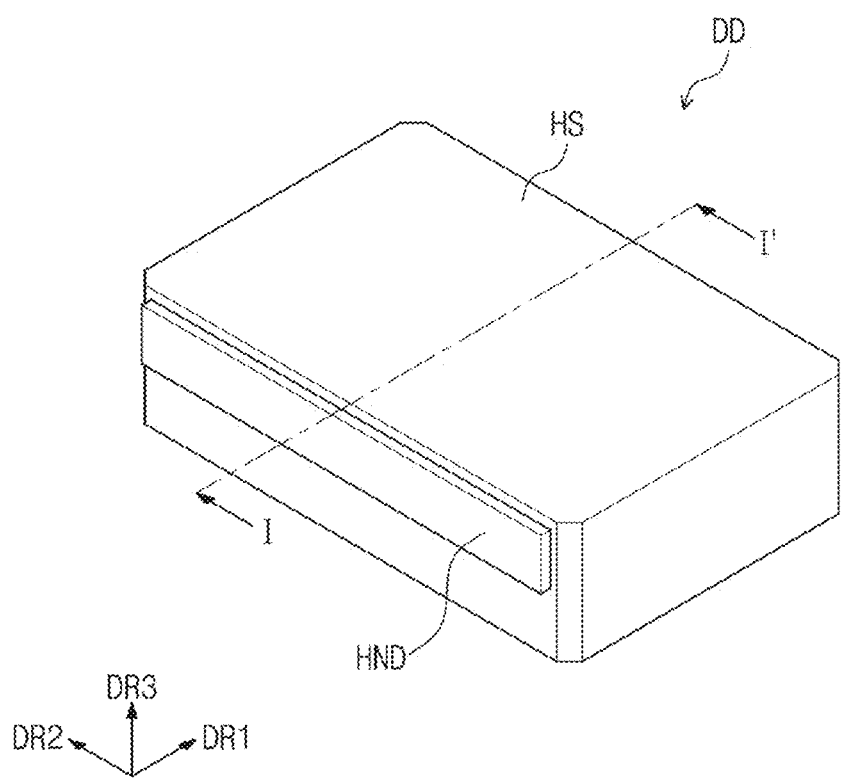
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In addition, terms such as "below," "lower," "above," "upper," and the like are used to describe the relationship of components shown in the drawings. The terms are used as a relative concept and are described with reference to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and are not interpreted in too ideal a sense or an overly formal sense unless explicitly defined herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
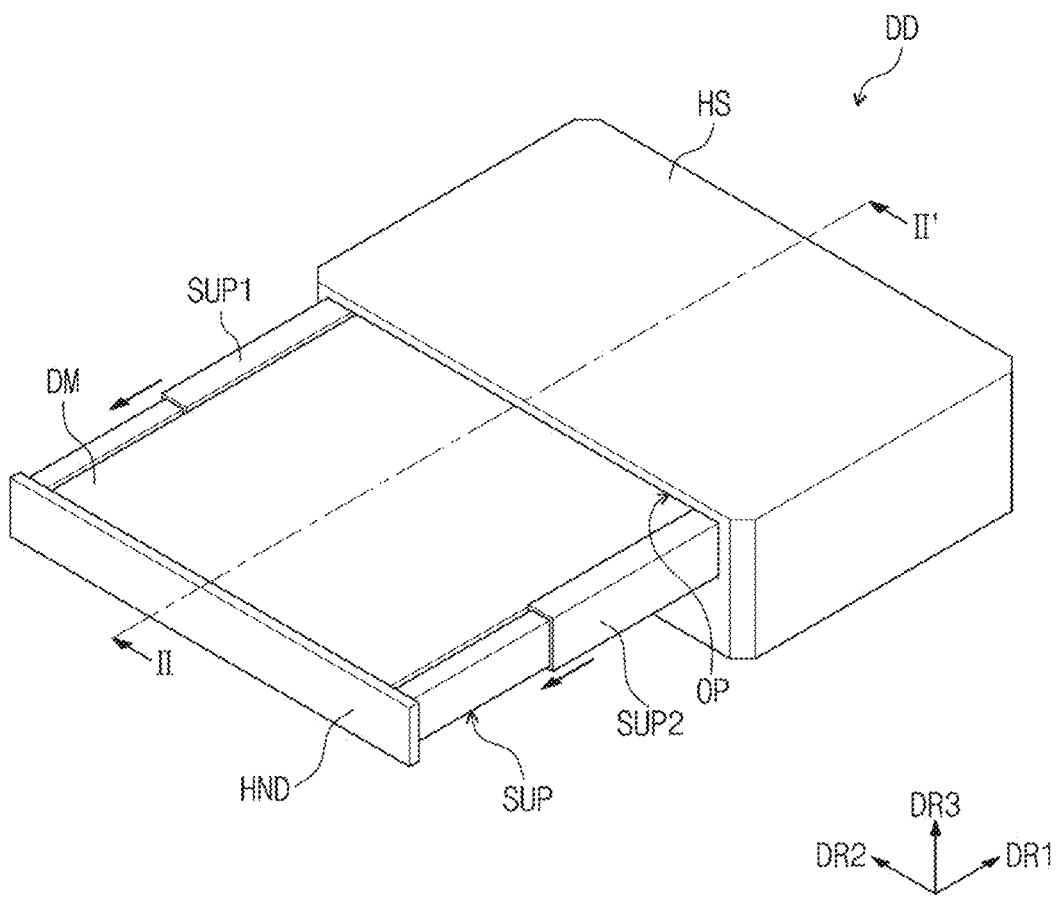
FIG. 2 is a view illustrating a display module drawn out of a housing illustrated in FIG. 1.

FIG. 1 is a perspective view of a display device according to an embodiment of the invention. FIG. 2 is a view illustrating a display module drawn out of a housing illustrated in FIG. 1.

Referring to FIG. 1 and FIG. 2, a display device DD according to an embodiment of the invention may include a housing HS, a display module DM received in the housing HS, a handle HND connected to the display module DM, and a support SUP adjacent to both ends of the display module DM.

Ina an embodiment, the housing HS may have a hexahedral shape, but the shape of the housing HS is not limited thereto. The housing HS may be extended to be longer in a second direction DR2 crossing a first direction DR1 than in the first direction DR1.

Hereinafter, a direction substantially perpendicular to a plane defined by the first and second directions DR1 and DR2 is defined as a third direction DR3. The third direction DR3 may be a thickness direction of the housing HS. In the disclosure, "when viewed on a plane" or "when viewed in a plan view" may mean when viewed in the third direction DR3.

An opening OP may be defined on one of opposing sides of the housing HS which are opposite to each other in the first direction DR1. The opening OP may be more adjacent to an upper portion of the housing HS than to a lower portion of the housing HS.

The display module DM may be wound on a roller disposed inside the housing HS and be drawn in and out through the opening OP. However, the embodiment of the invention is not limited thereto. The display module DM may be drawn out to the outside by being slid from the inside of the housing to the outside thereof without being wound on a roller.

The handle HND may be disposed on the outside of the housing HS and be adjacent to the opening OP. The handle HND may be adjacent to the upper portion of the housing HS. The handle HND may move in the first direction DR1.

When the handle HND moves in the first direction DR1 to be away from the housing HS, the display module DM may be drawn out of the housing HS through the opening OP. The handle HND may be operated by a user.

The support SUP may be disposed on opposing sides of the display module DM which are opposite to each other in the second direction DR2 and support the display module DM. The support SUP may include a first support SUP1 adjacent to one side of the display module DM, and a second support SUP2 adjacent to the other side of the display module DM. The one side and the other side of the display module DM may correspond to the two opposing sides of the display module DM which are opposite to each other in the second direction DR2.

Figure 3:
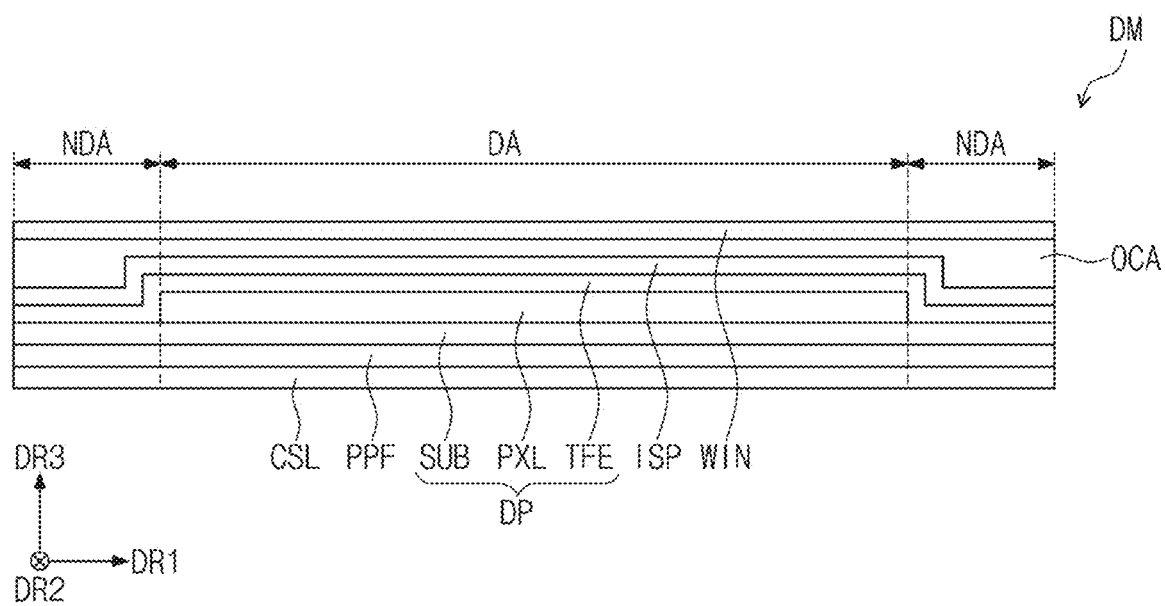
FIG. 3 is a view schematically showing a cross-section of the display module illustrated in FIG. 2.

FIG. 3 is a view schematically showing a cross-section of the display module illustrated in FIG. 2.

Referring to FIG. 3, the display module DM may include a display panel DP, an input sensing unit ISP disposed on the display panel DP, a window WIN disposed on the input sensing unit ISP, an adhesive OCA disposed between the input sensing unit ISP and the window WIN, a panel protective film PPF disposed below the display panel DP, and a cushion layer CSL disposed below the panel protective film PPF.

The display panel DP according to an embodiment of the invention may be a light emission-type display panel, but is not limited thereto. In an embodiment, for example, the display panel DP may be an organic light emission display panel or an inorganic light emission display panel. A light emission layer of the organic light emission display panel may include an organic light emission material. A light emission layer of the inorganic light emission display panel may include a quantum dot, a quantum load, and the like. Hereinafter, for convenience of description, embodiments where the display panel DP is an organic light emission display panel will be described in detail.

The display panel DP may include a substrate SUB, a pixel layer PXL disposed on the substrate SUB, and a thin film encapsulation layer TFE disposed on the substrate SUB to cover the pixel layer PXL. The substrate SUB is a transparent substrate and may include a flexible plastic substrate. In an embodiment, for example, the substrate SUB may include polyimide ("PI").

The substrate SUB may include a display region DA and a non-display region NDA around the display region DA. The pixel layer PXL may be disposed on the display region DA. The pixel layer PXL includes a plurality of pixels, and each of the pixels may include a light emission element.

The thin film encapsulation layer TFE may include at least two inorganic layers and an organic layer disposed between the inorganic layers. The inorganic layers include an inorganic material, and may protect the pixel layer PLX from moisture/oxygen. The organic layer includes an organic material, and may protect the pixel layer PXL from foreign materials such as dust particles.

The input sensing unit ISP may be disposed on the display panel DP. The input sensing unit ISP may include a plurality of sensors (not shown) for sensing an external input (e.g., a user's touch). The sensors may sense the external input in a capacitive manner. The input sensing unit ISP may be formed or manufactured directly on the display panel DP, when manufacturing the display panel DP. However, the embodiment of the invention is not limited thereto, and alternatively, the input sensing unit ISP may be manufactured as a separate panel from the display panel DP, and be attached to the display panel DP by an adhesive layer.

The panel protective film PPF may be disposed below the display panel DP. The panel protective film PPF may be defined as a protective substrate. The panel protective film PPF may protect a lower portion of the display panel DP. The panel protective film PPF may include a flexible plastic material. In an embodiment, for example, the panel protective film PPF may include polyethylene terephthalate ("PET").

The cushion layer CSL may protect the display panel DP by adsorbing external impacts applied to a lower portion of the display module DM. The cushion layer CSL may include a foam sheet having a predetermined elastic force.

Figure 4:
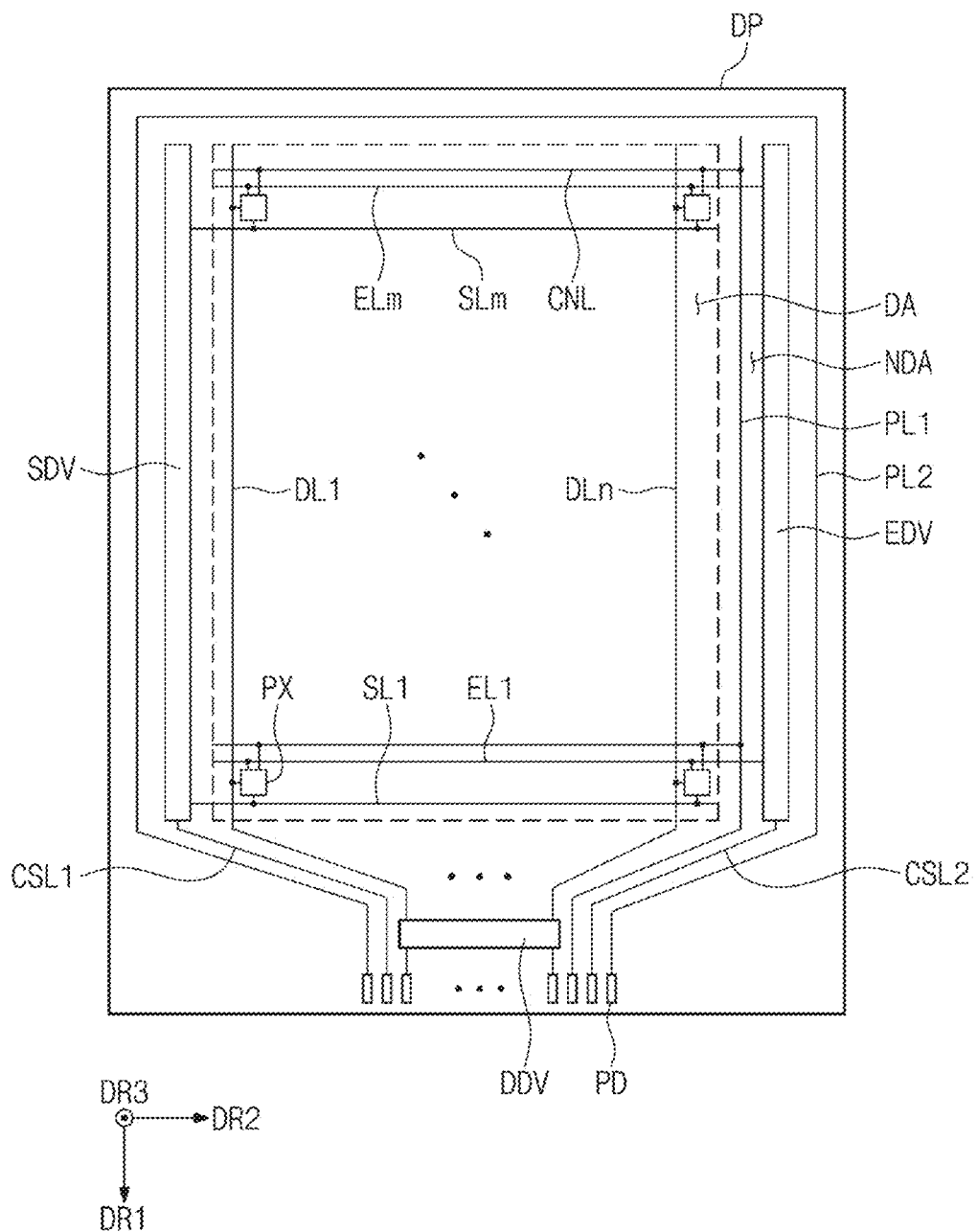
FIG. 4 is a plan view of the display panel illustrated in FIG. 3.

FIG. 4 is a plan view of the display panel illustrated in FIG. 3.

Referring to FIG. 4, in an embodiment, the display panel DP may include the display region DA and the non-display region NDA surrounding the display region DA.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, connection lines CNL, and a plurality of pads PD. m and n are natural numbers.

The pixels PX may be disposed in the display region DA. The scan driver SDV and the light emission driver EDV may be disposed in the non-display region NDA which is adjacent to each of the long sides of the display panel DP. The data driver DDV may be disposed in the non-display region NDA which is adjacent to any one short side of the short sides of the display panel DP. When viewed on a plane, the data driver DDV may be adjacent to a lower end of the display panel DP.

The scan lines SL1 to SLm may be extended in the second direction DR2 and connected to the pixels PX and the scan driver SDV. The data lines DL1 to DLn may be extended in the first direction DR1 and connected to the pixels PX and the data driver DDV. The light emission lines EL1 to ELm may be extended in the second direction DR2 and connected to the pixels PX and the light emission driver EDV.

The first power line PL1 may be extended in the first direction DR1 and disposed in the non-display region NDA. The first power line PL1 may be disposed between the display region DA and the light emission driver EDV, but is not limited thereto, and alternatively, the first power line PL1 may be disposed between the display region DA and the scan driver SDV.

The connection lines CNL may be extended in the second direction DR2 and arranged in the first direction DR1. The connection lines CNL may be connected to the first power line PL1 and the pixels PX. A first voltage may be applied to the pixels PX through the first power line PL1 and the connection lines CNL which are connected to each other.

A second power line PL2 may be disposed in the non-display region NDA. The second power line PL2 may extend along the long sides of the display panel DP and another short side of the display panel DP at which the data driver DDV is not disposed. The second power line PL2 may be disposed at an outer periphery than the scan driver SDV and the emission driver EDV.

Although not illustrated, the second power line PL2 may be extended toward the display region DA and connected to the pixels PX. A second voltage having a lower level than the first voltage may be applied to the pixels PX through the second power line PL2.

A first control line CSL1 is connected to the scan driver SDV, and when viewed on a plane, may be extended toward a lower end of the display panel DP. A second control line CSL2 is connected to the light emission driver EDV, and when viewed on a plane, may be extended from the light emission driver EDV toward the lower end of the display panel DP. The data driver DDV may be disposed between the first control line CSL1 and the second control line CSL2.

The pads PD may be disposed on the display panel DP. The pads PD may be more adjacent to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not illustrated, a timing controller configured to control the operation of the scan driver SDV, the data driver DDV, and the light emission driver EDV, and a voltage generator configured to generate the first and second voltages may be disposed on a printed circuit board. The timing controller and the voltage generator may be connected to corresponding pads PD through the printed circuit board.

The scan driver SDV generates a plurality of scan signals, and the scan signals may be applied to the pixels PX through the scan lines SL1 to SLm. The data driver DDV generates a plurality of data voltages, and the data voltages may be applied to the pixels PX through the data lines DL1 to DLn. The light emission driver EDV generates a plurality of light emission signals, and the light emission signals may be applied to the pixels PX through the light emission lines EL1 to ELm.

The pixels PX may be provided with the data voltages in response to the scan signals. The pixels PX may display an image by emitting light of luminance corresponding to the data voltages in response to the light emission signals. The light emission duration (or a dimming ratio) of the pixels PX may be controlled by the light emission signals.

Figure 5:
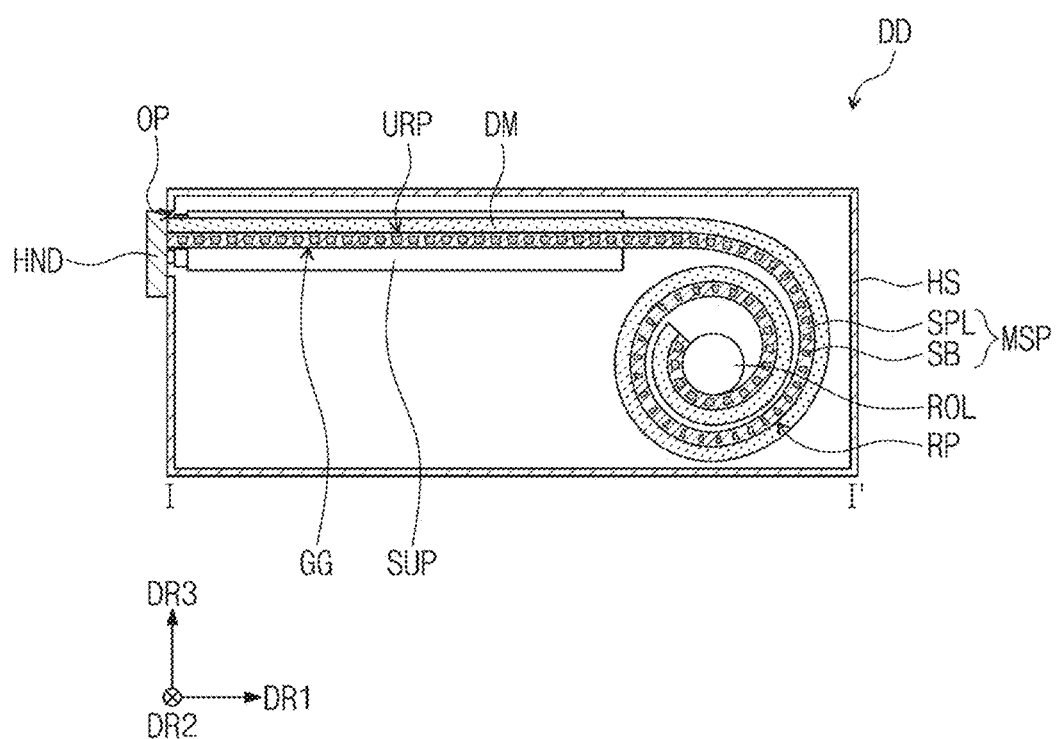
FIG. 5 is a cross-sectional view taken along line I-I' illustrated in FIG. 1.

FIG. 5 is a cross-sectional view taken along line I-I' illustrated in FIG. 1.

Referring to FIG. 5, an embodiment of the display device DD may include the housing HS, the display module DM, a roller ROL, a module support MSP, the support SUP, and the handle HND. The display module DM, the roller ROL, the module support MSP, and the support SUP may be received in the housing HS.

The roller ROL is disposed in the housing HS, and may be adjacent to the other side of the housing HS, which is opposite to one side of the housing HS on which the opening OP is defined. When viewed in the second direction DR2, the roller ROL may have a circular shape. In an embodiment, for example, the roller ROL may have a cylindrical shape extending in the second direction DR2. The roller ROL may rotate in a clockwise direction and in a counterclockwise direction. Although not illustrated, the display device DD may further include a driving unit for rotating the roller ROL.

The display module DM may extend in the first direction DR1 and be wound on the roller ROL. The display module DM may be wound on the roller ROL and unwound from the roller ROL in the first direction DR1. One end (or a first end) of the display module DM may be connected to the roller ROL.

A portion of the display module DM may be wound on the roller, and another portion of the display module DM may not be wound on the roller ROL but be disposed to overlap the support SUP. A portion of the display module DM overlapping the support SUP may be maintained in a flat state. The other end (or a second end) of the display module DM, which is the opposite end of the one end of the display module DM, may be connected to the handle HND. The other end of the display module DM may be adjacent to the opening OP.

The front surface of display module DM may be defined as a surface which displays an image. The module support MSP may be disposed below the display module DM and support the display module DM. The module support MSP may be bonded to the back surface of the display module DM, which is the opposite surface of the front surface of the display module DM. In an embodiment, for example, the module support MSP may be bonded to the back surface of the display module DM through a pressure sensitive adhesive.

The module support MSP may extend in the first direction DR1 and be wound on the roller ROL. The module support MSP may be wound on the roller ROL and unwound from the roller ROL in the first direction DR1. The module support MSP may be, together with the display module DM, wound on the roller ROL and unwound from the roller ROL.

One end (or a first end) of the module support MSP may be connected to the roller, and the other end (or a second end) of the module support MSP may be connected to the handle HND. The other end of the module support MSP may be adjacent to the opening OP. A portion of the module support MSP may be wound on the roller, and another portion of the module support MSP may not be wound on the roller ROL but be disposed to overlap the support SUP.

The module support MSP may include an unrolling portion URP maintained in a flat state, and a rolling portion RP wound and unwound in the first direction DR1. The rolling portion RP may be connected to the roller ROL and be wound on the roller ROL and unwound from the roller ROL. The unrolling portion URP may not be wound on the roller ROL.

The rolling portion RP may be disposed below a portion of the display module DM not overlapping the support SUP, and together with the display module DM, be wound on the roller ROL and unwound from the roller ROL. The unrolling portion URP may be disposed below the portion of the display module DM overlapping the support SUP and may be maintained in a flat state.

The module support MSP may include a support layer SPL disposed below the display module DM, and a plurality of support bars SB disposed below the support layer SPL. Widths of the support bars SB may be different from each other depending on the positions of the support bars SB. The structure of the support bars SB will be described in greater detail with reference to FIG. 7 below.

A guide groove GG may be defined in the support SUP. The module support MSP may be disposed in the guide groove GG and move in the first direction DR1 along the guide groove GG. The module support MSP may be disposed in the guide groove GG and be supported by the support SUP, and the module support MSP may support the display module DM. Accordingly, the support SUP may serve to support the display module DM.

Figure 6:
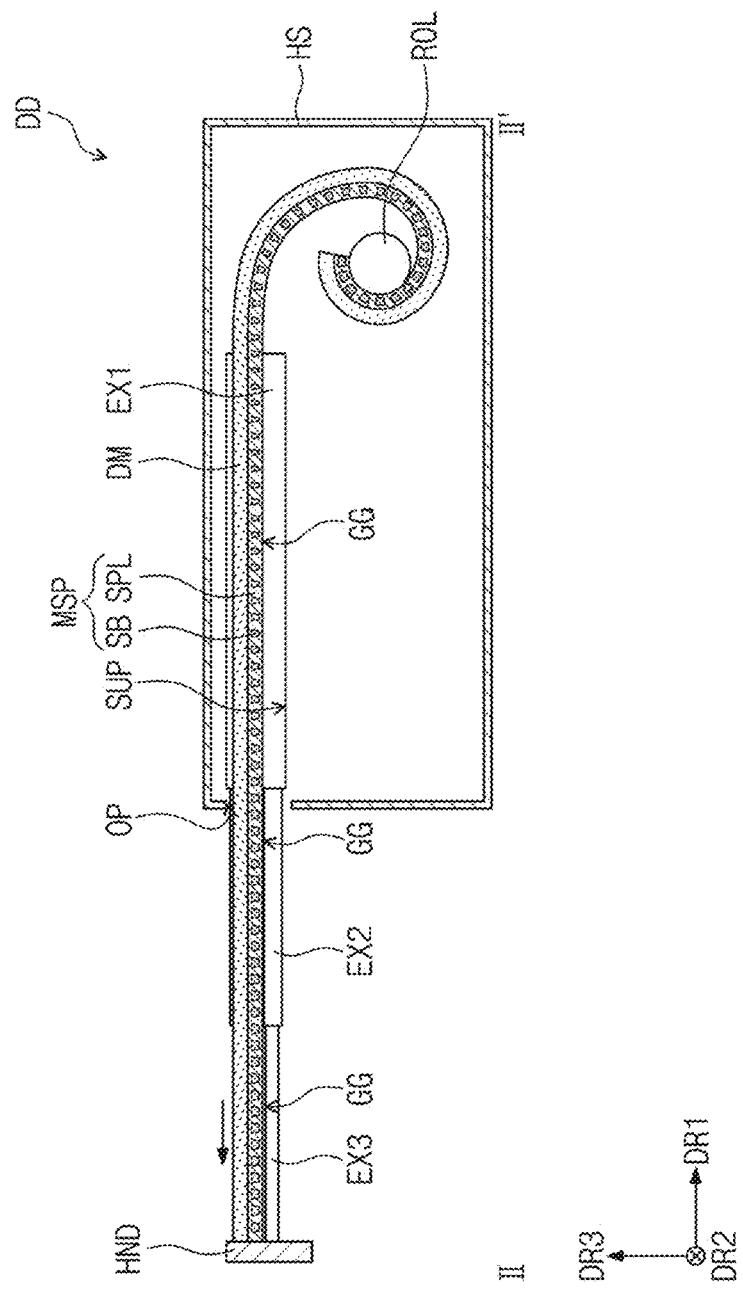
FIG. 6 is a cross-sectional view taken along line II-II' illustrated in FIG. 2.

FIG. 6 is a cross-sectional view taken along line II-II' illustrated in FIG. 2.

Referring to FIG. 6, in an embodiment of the display device DD, the handle HND may move in the first direction DR1 to be away from the housing HS. According to the movement of the handle HND, the display module DM and the module support MSP connected to the handle HND may move in the first direction DR1.

The display module DM and the module support MSP are unwound from the roller ROL, and the unwound display module DM and the module support MSP may be drawn to the outside of the housing HS through the opening OP. An operation in a state in which the display module DM is exposed to the outside of the housing HS may be defined as an open mode. In the open mode, an exposed portion of the display module DM may be extended.

When the display module DM and the module support MSP are drawn out of the housing HS according to the movement of the handle HND, the support SUP connected to the handle HND may be extended to the outside of the housing HS through the opening OP. The support SUP may be extended to the outside of the housing HS and support the display module DM from the outside. In an embodiment, for example, the module support MSP moved to the outside of the housing HS is supported by the support SUP, and the module support MSP supported by the support SUP may support the display module DM.

In an embodiment, the support SUP may include a first extension EX1, a second extension_EX2, and a third extension_EX3 to be extended to the outside of the housing HS. The second extension_EX2 may be disposed between the first extension_EX1 and the third extension_EX3.

In an embodiment, the second extension_EX2 may be drawn into and out of the first extension_EX1, and the third extension_EX3 may be drawn into and out of the second extension_EX2 to have a structure which may be extended like an antenna. The first extension_EX1 may be disposed inside the housing HS, and the second and third extensions_EX2 and_EX3 may move to the outside of the housing HS. The third extension_EX3 may be connected to the handle HND.

In each of the first, second, and third extensions_EX1,_EX2, and_EX3, the guide groove GG may be defined. The guide grooves GG defined in the first, second, and third extensions_EX1,_EX2, and_EX3 may be defined as a continuous space overlapping each other in the first direction DR1. The module support MSP may be disposed in the guide grooves GG.

When the handle HND moves in the first direction DR1 to be close to the housing HS, the handle HND may be disposed adjacent to the opening OP on the outside of the housing HS. According to the movement of the handle HND, the support SUP may be reduced in the first direction DR1 and be disposed inside the housing HS, and the display module DM and the module support MSP may be drawn into the housing HS. An operation in such a state may be defined as a closed mode.

Figure 7:
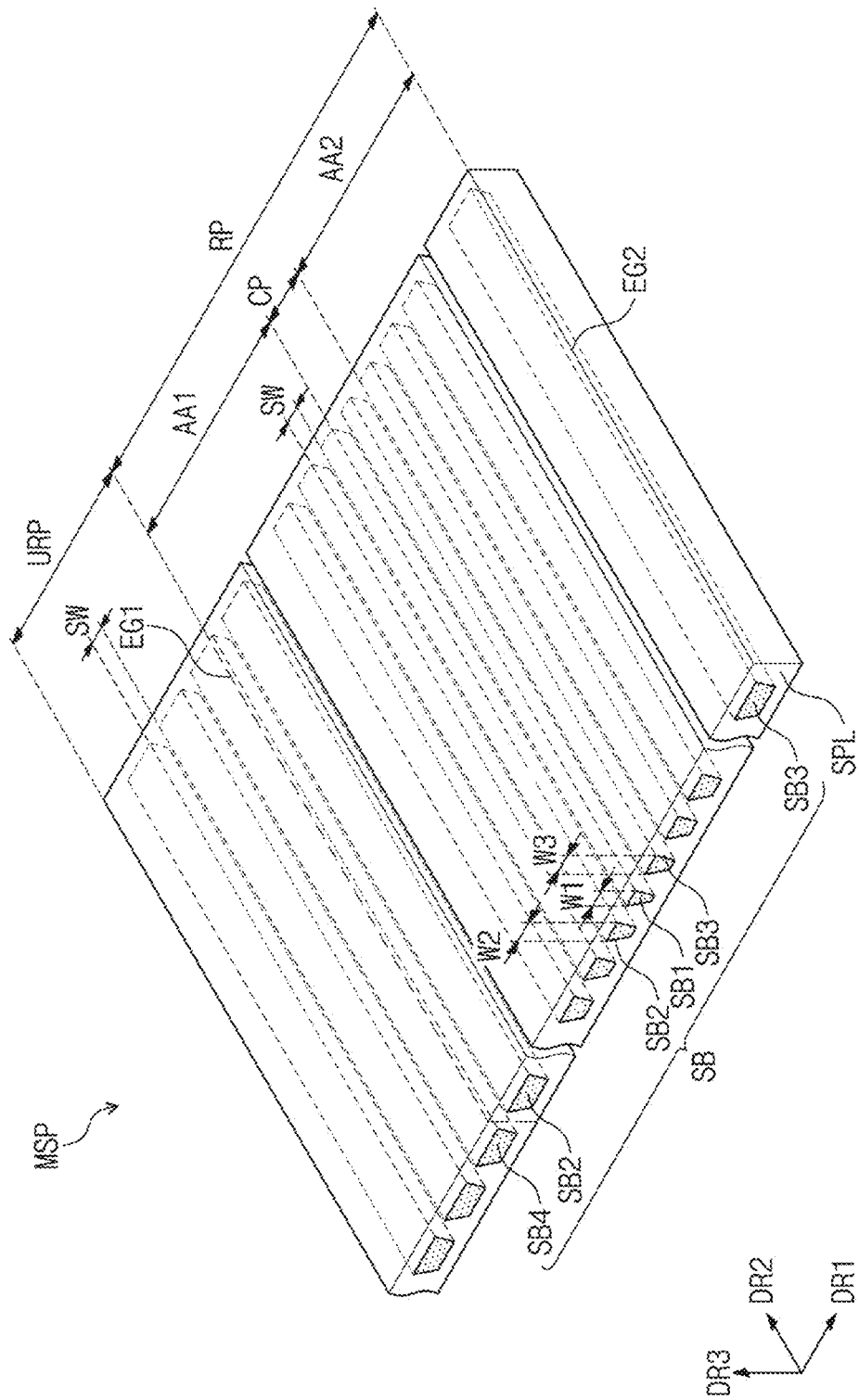
FIG. 7 is a view illustrating a portion of a module support illustrated in FIG. 5.

FIG. 7 is a view illustrating the structure of the module support illustrated in FIG. 5.

For convenience of description, a module support MSP in a flat state is illustrated in FIG. 7.

Referring to FIG. 7, an embodiment of the support layer SPL may include, similar to the module support MSP, an unrolling portion URP maintained in a flat state, and a rolling portion RP wound and unwound in the first direction DR1. The rolling portion RP may be connected to the roller ROL and be wound on the roller ROL and unwound from the roller ROL, and the unrolling portion URP may not be wound on the roller ROL.

The rolling portion RP may include a central portion CP, a first region AA1 between a first edge EG1 and the central portion CP, and a second region AA2 between a second edge EG2 and the central portion CP. The first edge EG1 and the second edge EG2 may be respectively defined as opposing ends of the rolling portion RP which are opposite to each other in the first direction DR1. One end of the opposing ends of the rolling portion RP may be defined as the first edge EG1, and the other end of the opposing ends of the rolling portion RP may be defined as the second edge EG2. The central portion CP may be defined as a region adjacent to a center point of the rolling portion RP based on the first direction DR1.

In an embodiment, as shown in FIG. 7, the first region AA1 may be disposed on the left side of the central portion CP and the second region AA2 may be disposed on the right side of the central portion CP. The first region AA1, the central portion CP, and the second region AA2 may be arranged in the first direction DR1. The first region AA1 and the second region AA2 may have an area. The unrolling portion URP may be extended from the first edge EG1 in the first direction DR1.

The support bars SB may be extended in the second direction DR2, and be arranged in the first direction DR1. Illustratively, in FIG. 7, the support bars SB disposed in the support layer SPL are illustrated as dotted lines. The support bars SB may be spaced apart from each other at equal or constant intervals in the first direction DR1, but an interval between the support bars SB is not limited thereto.

Opposing ends of each of the support bars SB, which are opposite to each other in the second direction DR2, may not be disposed in the support layer SPL but be exposed to the outside of the support layer SPL. The support bars SB may be of a rigid type. In an embodiment, for example, the support bars SB may include a metal. The support bars SB may include aluminum, stainless steel, or invar. In an embodiment, the support bars SB may include a metal which may attach to a magnet. The support bars SB may have a greater modulus than the support layer SPL.

The support layer SPL may include an elastomer having a predetermined elastic force. In an embodiment, for example, the support layer SPL may include at least one selected from thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, and ethylene-vinyl acetate.

The support bars SB may have a greater modulus than the support layer SPL. The support layer SPL may have a modulus in a range of about 20 kilopascals (KPa) to about 20 megapascals (MPa). The support bars SB may have a modulus in a range of about 1 gigapascal (GPa) to about 200 gigapascals (GPa).

When the support bars SB are disposed inside the support layer SPL and the support layer SPL is rolled, stress may occur in portions of the support layer SPL between the support bars SB. The stress may affect the display module DM. The support bars SB according to an embodiment of the invention may have a structure for reducing stress. The structure of the support bars SB will be described in detail below.

When viewed in the second direction DR2, the support bars SB may have an inverted trapezoidal shape. Due to the inverted trapezoidal shape, each of the support bars SB may include a long side facing a rear surface of the display module DM, and a short side disposed further below than the long side. However, the shape of the support bars SB is not limited thereto, and alternatively, the support bars SB may have various shapes such as a triangular, quadrangular, or circular shape. The support bars SB may have different widths from each other. Here, the width may be defined based on the length of upper sides of the support bars SB in the first direction DR1, when viewed in the second direction DR2. Widths of the support bars SB in the first direction DR1 may gradually increase from one point of the rolling portion RP toward opposing ends of the rolling portion RP opposite to each other in the first direction DR1. The one point of the rolling portion RP may be defined as the central portion CP of the rolling portion RP with respect to the first direction DR1. A first support bar (or a support bar in the central portion CP) SB1 may have the smallest width among the support bars SB. The first support bar SB1 may have a first width W1. Second support bars (or support bars in the first region AA1) SB2 may have a width greater than that of the first support bar SB1. The second support bars SB2 may have a second width W2 which is greater than the first width W1. Third support bars (or supports bars in the second region AA2) SB3 may have a width greater than that of the first support bar SB1. The third support bars SB3 may have a third width W3 which is greater than the first width W1.

The second support bars SB2 may have different widths from each other. In an embodiment, for example, second widths W2 of the second support bars SB2 in the first direction DR1 may be greater than that of the first support bar SB1 and the second widths W2 of the second support bars SB2 gradually increase as being closer to the first edge EG1. Among the second support bars SB2, widths of second support bars SB2 most adjacent to the first edge EG1 may be the greatest.

The third support bars SB3 may have different widths from each other. In an embodiment, for example, third widths W3 of the third support bars SB3 in the first direction DR1 may be greater than that of the first support bar SB1 and the third widths W3 of the third support bars SB2 gradually increase as being closer to the second edge EG2. Among the third support bars SB3, widths of third support bars SB3 most adjacent to the second edge EG2 may be the greatest.

The second support bars SB2 and the third support bars SB3 may have structures symmetrical to each other with respect to the central portion CP. Therefore, the widths of the second support bars SB2 and the widths of the third support bars SB3 may be symmetrical to each other with respect to the central portion CP. The first, second, and third support bars SB1, SB2, and SB3 may be arranged at equal or constant intervals SW in the first direction DR1.

Fourth support bars (or support bars in the unrolling portion URP) SB4 may have a same width with each other. The fourth support bars SB4 may have a same with as the width of the second support bar SB2 adjacent to the first edge EG1 or the width of the third support bar SB3 adjacent to the second edge EG2. That is, widths of the fourth support bars SB4 may be the same as the width of a second support bar SB2 having the greatest width among the second support bars SB2 or the width of a third support bar SB3 having the greatest width among the third support bars SB3.

The fourth support bars SB4 may be arranged at equal or constant intervals SW in the first direction DR1. In an embodiment, the first, second, third, and four support bars SB1, SB2, SB3, and SB4 may be arranged at equal or constant intervals SW in the first direction DR1.

The number of the second support bars SB2 may be the same as the number the third support bars SB3. The support bars SB disposed in the rolling portion RP include a single first support bar SB1 and the same number of the second support bars SB2 and the third support bars SB3, so that the number of the support bars SB disposed in the rolling portion RP may be an odd number. However, the embodiment of the invention is may not limited thereto. Alternatively, the number of the first support bars SB1 and the number of the second support bars SB2 may be different from each other.

The thickness of each of the support bars SB may be defined as a numerical value measured based on the third direction DR3. In an embodiment, for example, the thickness of each of the support bars SB may be defined as a measured numerical value in a direction perpendicular to one surface of the support layer SPL facing the display module DM or in a direction perpendicular to the first direction and the second direction DR1 and DR2. The support bars SB may have a same thickness as each other. In an embodiment, the first, second, and third support bars SB1, SB2, SB3 may have a same thickness as each other.

In a case where, the support layer SPL is omitted, and the support bars SB are bonded to a lower surface of the display module DM to support the display module DM, portions of the display module DM in a space between the support bars SB may be deformed when the display module DM is repeatedly rolled and unrolled. In this case, portions of the display module DM overlapping the space between the support bars SB may be stretched and lowered, and such deformation may be visually recognized to the outside as a folded shape. That is, the surface quality of the display module DM may be degraded.

In an embodiment, the support bars SB having greater rigidity may support the display module DM, and the support layer SPL having a predetermined elasticity may provide a flat upper surface to the display module DM. In such an embodiment, since the display module DM is bonded to the flat upper surface of the support layer SPL, a portion of the display module DM overlapping a space between the support bars SB may not be deformed and may be effectively maintained in a flat state.

In an embodiment, since the widths of the support bars SB are provided differently depending on the degree of deformation of the display module DM, it is possible to optimize the strain and support properties according to the positions of the portions of the display module DM. Accordingly, the surface quality of the display module DM may be improved. The optimization of strain and support properties according to the positions of the portions of the display module DM will be described in detail with reference to FIG. 12A and FIG. 12B below.

Figure 8:
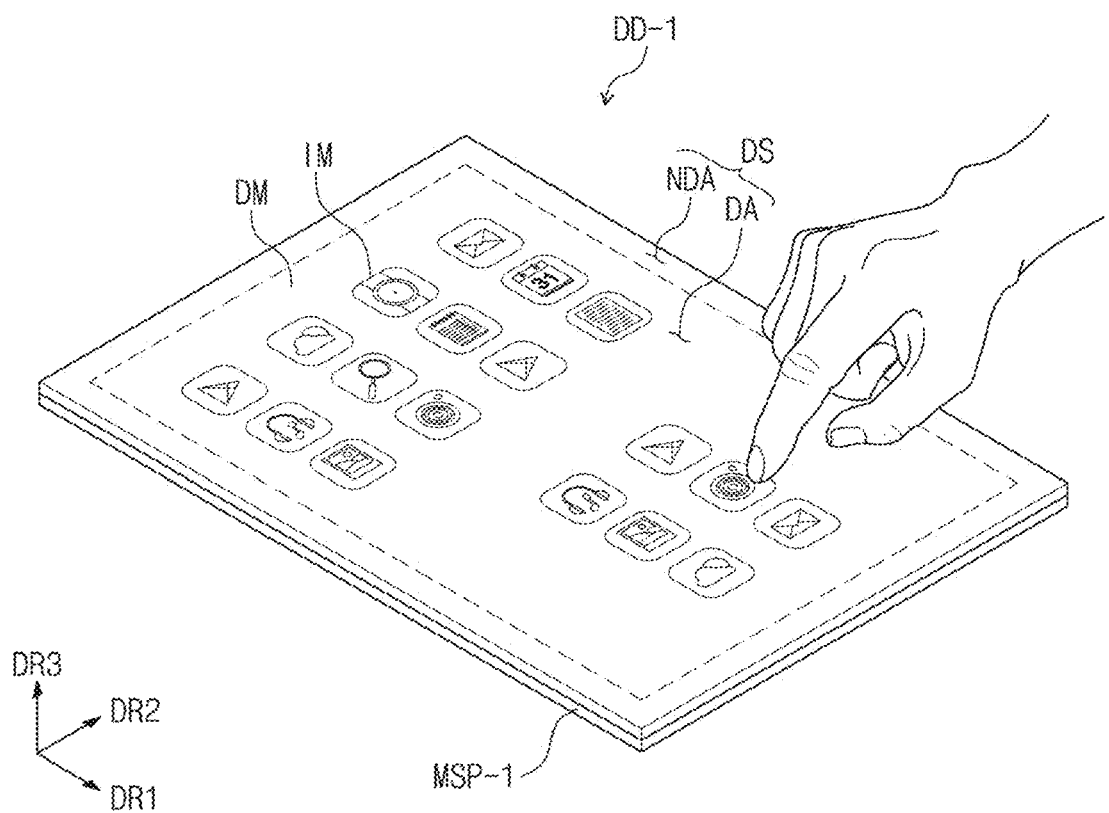
FIG. 8 is a perspective view of a display device according to an alternative embodiment of the invention.
Figure 9:
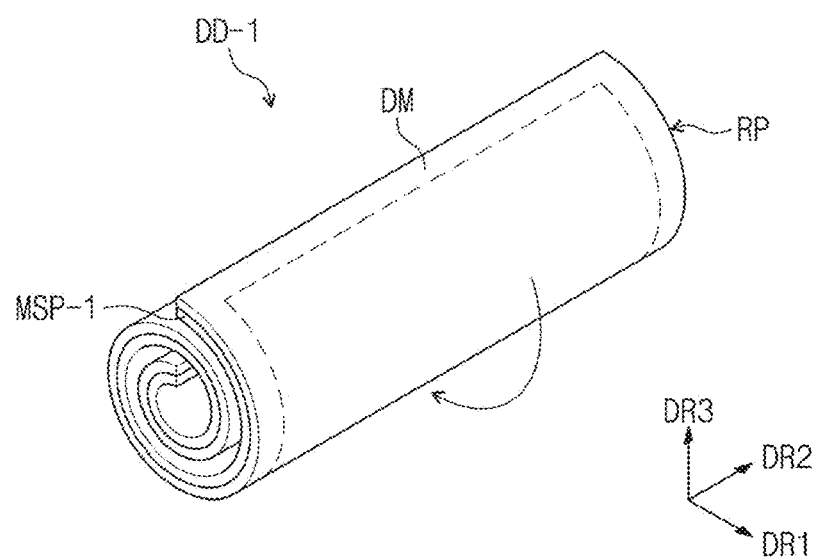
FIG. 9 is a view illustrating the display device illustrated in FIG. 8 in a rolled state.

FIG. 8 is a perspective view of a display device according to an alternative embodiment of the invention. FIG. 9 is a view illustrating the display device illustrated in FIG. 8 in a rolled state.

Referring to FIG. 8 and FIG. 9, a display device DD-1 according to an embodiment of the invention may have a rectangular shape which has long sides extending in a first direction DR1 and short sides extending in a second direction DR2 which crosses the first direction DR1. However, the invention is not limited thereto. Alternatively, the display device DD-1 may have various shapes such as a circular shape or a polygonal shape.

In an embodiment, the display device DD-1 may include a display module DM and a module support MSP-1 disposed below the display module DM to support the display module DM. An upper surface of the display module DM may be defined as a display surface DS, and may have a plane defined by the first direction DR1 and the second direction DR2. Images IM generated in the display module DM may be provided to a user through the display surface DS.

The display surface DS may include a display region DA and a non-display region NDA around the display region DA. The display region DA may display an image, and the non-display region NDA may not display an image. The non-display region NDA may surround the display region DA, and may define the edge of the display module DM printed in a predetermined color.

Referring to FIG. 9, the display device DD-1 may be a rollable flexible display device. In an embodiment, the display device DD-1 may be a scroll-type display device. The display module DM and the module support MSP-1 may be rolled with respect to the first direction DR1. The display module DM and the module support MSP-1 may be rolled into a circular shape. The user may roll and carry the display device DD-1, and selectively, may unfold the display device DD-1 to watch an image, so the portability of the display device DD-1 may be increased.

In such an embodiment, as shown in FIGS. 8 and 9, the module support MSP-1 may not include an unrolling portion URP shown in FIG. 5 which is maintained in a flat state during a rolling operation. In such an embodiment, during a rolling operation, the entire display module DM and the module support MSP-1 may be rolled.

Figure 10:
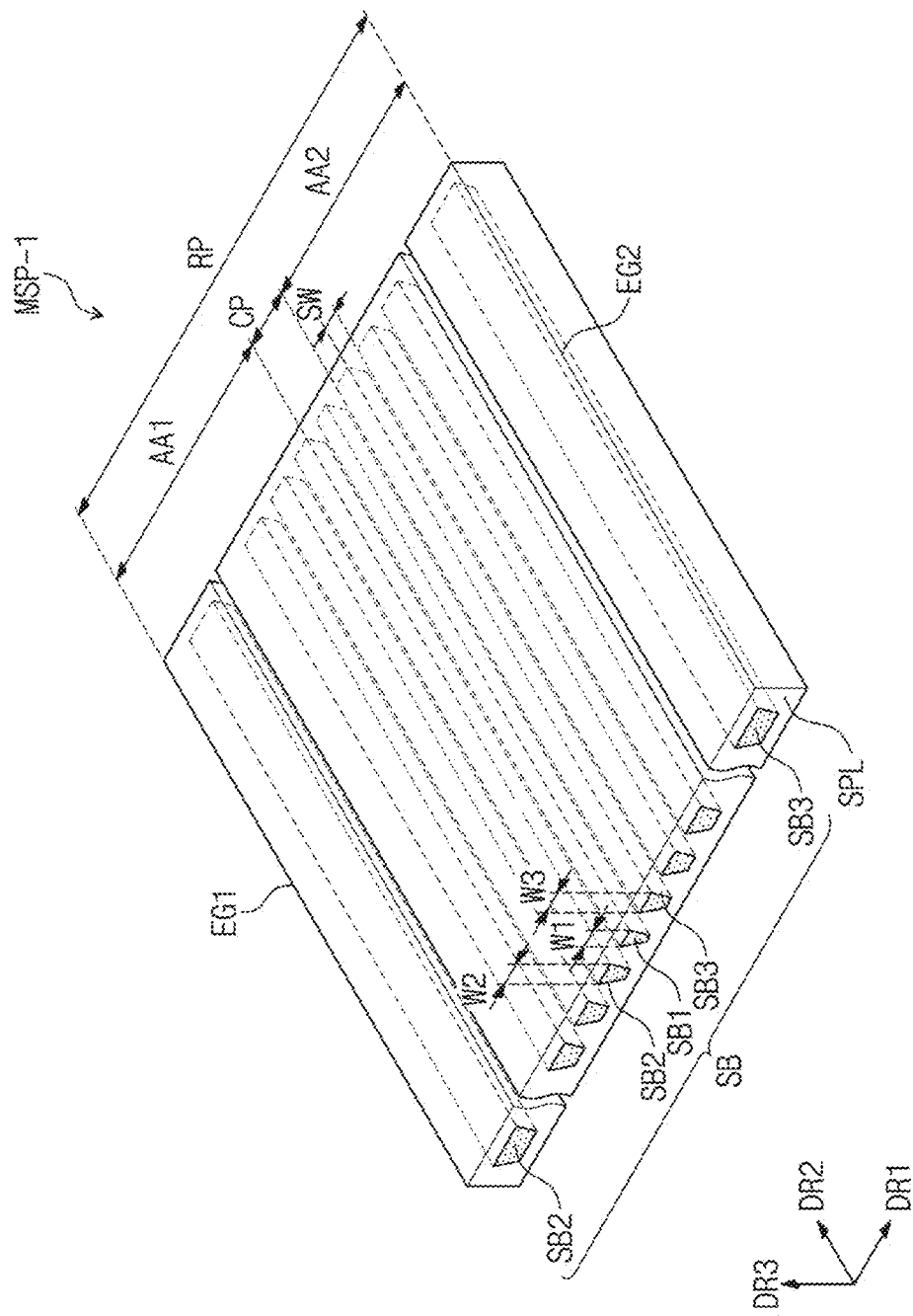
FIG. 10 is a view illustrating the configuration of the module support illustrated in FIG. 8.

FIG. 10 is a view illustrating the structure of the module support illustrated in FIG. 8.

Referring to FIG. 10, an embodiment of the module support MSP-1 may include a support layer SPL and a plurality of support bars SB disposed below the support layer SPL. The support layer SPL may be defined as a rolling portion RP, and the rolling portion RP may include a central portion CP and first and second regions AA1 and AA2. The support bars SB may include first, second, and third support bars SB1, SB2, and SB3.

The structure of the rolling portion RP and the structures of the first, second, and third support bars SB1, SB2, and SB3 are the same as those of the rolling portion RP and the first, second, and third support bars SB1, SB2, and SB3 described above with reference to FIG. 7, and thus, any repetitive detailed descriptions thereof will be omitted.

Figure 11:
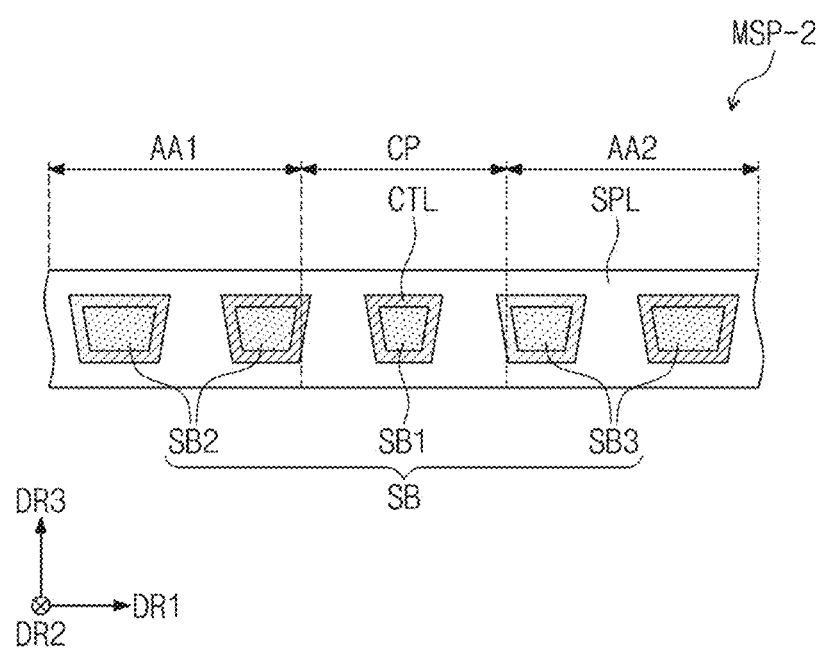
FIG. 11 is a view illustrating the configuration of a module support according to an alternative embodiment of the invention.

FIG. 11 is a view illustrating the configuration of a module support according to an alternative embodiment of the invention.

Illustratively, FIG. 11 illustrates a side surface of a module support MSP-2 viewed in the second direction DR2.

Referring to FIG. 11, an embodiment of the module support MSP-2 may include a support layer SPL, a plurality of support bars SB disposed in the support layer SPL, and a plurality of coating layers CTL disposed in the support layer SPL. The structures of the support layer SPL and the support bars SB may substantially the same as the structures of the support layer SPL and the support bars SB described above with reference to FIG. 7.

In such an embodiment, the coating layers CTL may surround the support bars SB. One support bar SB may be disposed inside one coating layer CTL. The upper surface and lower surface of each of the support bars SB opposite to each other in the third direction DR3, and opposing side surfaces of each of the support bars SB opposite to each other in the first direction DR1 may be covered by a corresponding coating layer CTL.

Outer surfaces of the coating layers CTL opposite to inner surfaces of the coating layers CTL in contact with the support bars SB may also have inverted trapezoidal shapes corresponding to that of the support bars SB, but the shapes of the outer surfaces of the coating layers CTL are not limited thereto.

The coating layers CTL may include a polymer material. In an embodiment, for example, the coating layers CTL may include PI, PET, polycarbonate ("PC"), or polyamide ("PA"). However, the embodiment of the invention is not limited thereto, and the coating layers CTL may include various materials as long as it is a material including a polymer.

The support layer SPL, the support bars SB, and the coating layers CTL may have moduli different from each other. In an embodiment, for example, the support layer SPL may have a modulus less than those of the support bars SB. The moduli of the coating layers CTL may be greater than the modulus of the support layer SPL, and less than the moduli of the support bars SB.

In a case where the support layer SPL having a modulus less than those of the support bars SB directly covers the support bars SB, as the difference in modulus between the support bars SB and the support layer SPL increases, strain generated during rolling may be concentrated to the support layer SPL. In this case, the strain generated in the support bars SB decreases and the strain generated in the support layer SPL increases, so that the deformation of the support layer SPL may become large.

In an embodiment of the invention, the coating layers CTL having a modulus greater than that of the support layer SPL and less than those of the support bars SB may cover the support bars SB, and be disposed inside the support layer SPL. In such an embodiment, the coating layers CTL may absorb strain generated in the support bars SB. Accordingly, the difference in modulus between components of the module support MSP-2 decreases to reduce the deformation of the support layer SPL.

Figure 12A:
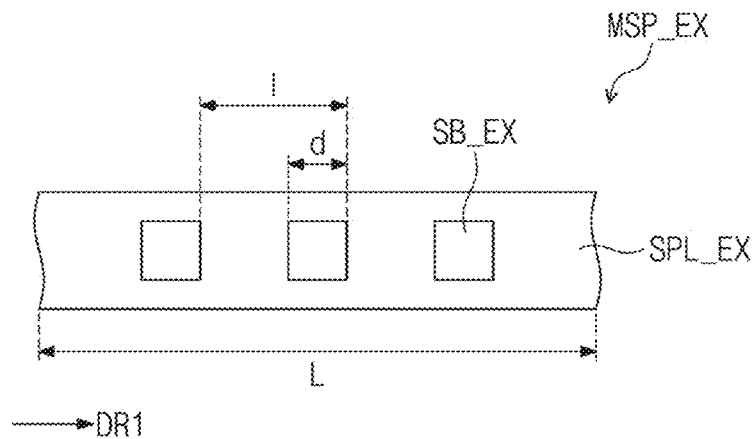
FIG. 12A is a view exemplarily illustrating a portion of a module support having a configuration different from that of FIG. 7.
Figure 12B:
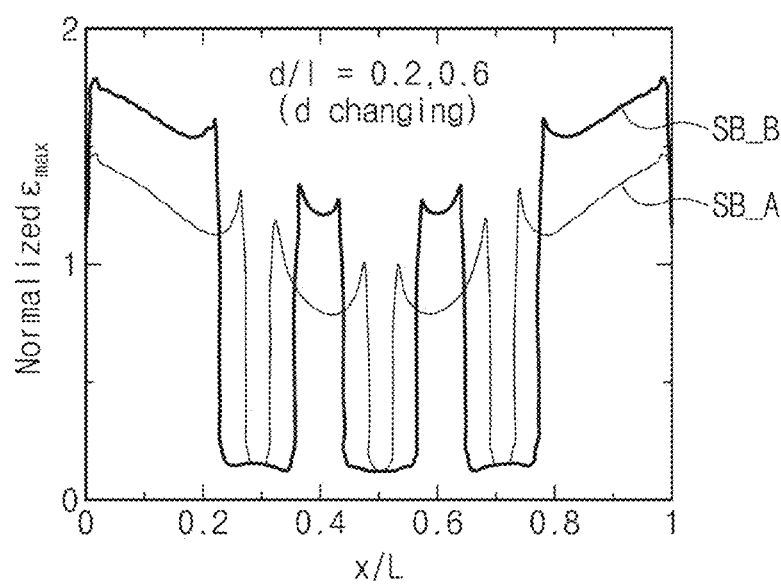
FIG. 12B is a graph illustrating the strain according to the position in a first direction of portions of the module support illustrated in FIG. 12A.

FIG. 12A is a view exemplarily illustrating a portion of a module support having a configuration different from that of FIG. 7. FIG. 12B is a graph illustrating the strain according to the position in a first direction of portions of the module support illustrated in FIG. 12A.

Referring to FIG. 7, FIG. 12A, and FIG. 12B, when the length of a module support MSP_EX in the first direction DR1 is denoted by L, the X axis is a distance of a position from one side of the module support MSP_EX in the first direction DR1. The Y axis is the maximum strain of the module support MSP_EX according to the position in the module support MSP_EX in the first direction DR1. In FIG. 12A and FIG. 12B, 1 denotes a distance between right-side surfaces of support bars SB_EX adjacent to each other. d denotes a width of the support bars SB_EX in the first direction DR1.

A first graph SB_A in FIG. 12B represents the maximum strain of the module support MSP_EX when the d/1 is about 0.2. A second graph SB_B in FIG. 12B represents the maximum strain of the module support MSP_EX when the d/1 is about 0.6.

In the first graph SB_A and the second graph SB_B, the Y axis value gradually decreases as the X axis value increases, and then gradually increases starting from about 0.5. That is, the maximum strain of the module support MSP_EX may gradually decrease from one side of the module support MSP_EX toward the first direction DR1, and then, may gradually increase starting from a support bar S_EX in a central portion of the module support MSP_EX.

In the first graph SB_A and the second graph SB_B, when the X axis has a value of about 0.3, about 0.5, or about 0.7, the Y axis value significantly decreases compared to the periphery. That is, a portion in which the maximum strain of the module support MSP_EX significantly decreases is shown three times, which corresponds to a portion in which three support bars SB_EX are disposed. The maximum strain of the module support MSP_EX has a lower value in a support bar SB_EX portion than in a support layer SPL_EX portion, and the maximum strain of the module support MSP_EX may have the minimum value in a portion in which the support bars SB_EX are disposed.

When the first graph SB_A and the second graph SB_B are compared, the Y axis value of the first graph SB_A and the Y axis value of the second graph SB B may have a same minimum value in a portion in which the support bars SB_EX are disposed. However, in the support layer SPL_EX portion, the Y axis value of the second graph SB_B may be greater than the Y axis value of the first graph SB_A. That is, the maximum strain in the support layer SPL_EX may become greater as widths of the support bars SB_EX increase.

The display module DM in a rolled state may have different strains depending on the position. Since there is no shear strain generated in a central portion of the display module DM, strain has a maximum value. Since shear strain increases from the central portion of the display module DM toward opposing ends thereof opposite to each other, the strain decreases.

As shown in the first graph SB__A and the second graph SB_B, as the widths of the support bars SB_EX increase, the strain of the support layer SPL_EX may increase. Therefore, on the central portion of the display module DM in which the strain has the maximum value, a first support bar SB1 have the least width may be disposed. Therefore, in an embodiment, the support layer SPL around the first support bar SB1 may have the smallest strain. In such an embodiment, by the support layer SPL around the first support bar SB1, stress transmitted to the central portion of the display module DM may be reduced. Therefore, buckling occurring in the central portion of the display module DM may be effectively prevented.

In such an embodiment, since the strain decreases toward the opposing ends of the display module DM, first support bars SB1 and second support bars SB2 may have widths increasing as being toward the opposing ends may be disposed to improve the overall support properties of the module support MSP illustrated in FIG. 7. Accordingly, the surface quality of the display module DM may be improved.

Figure 13A:
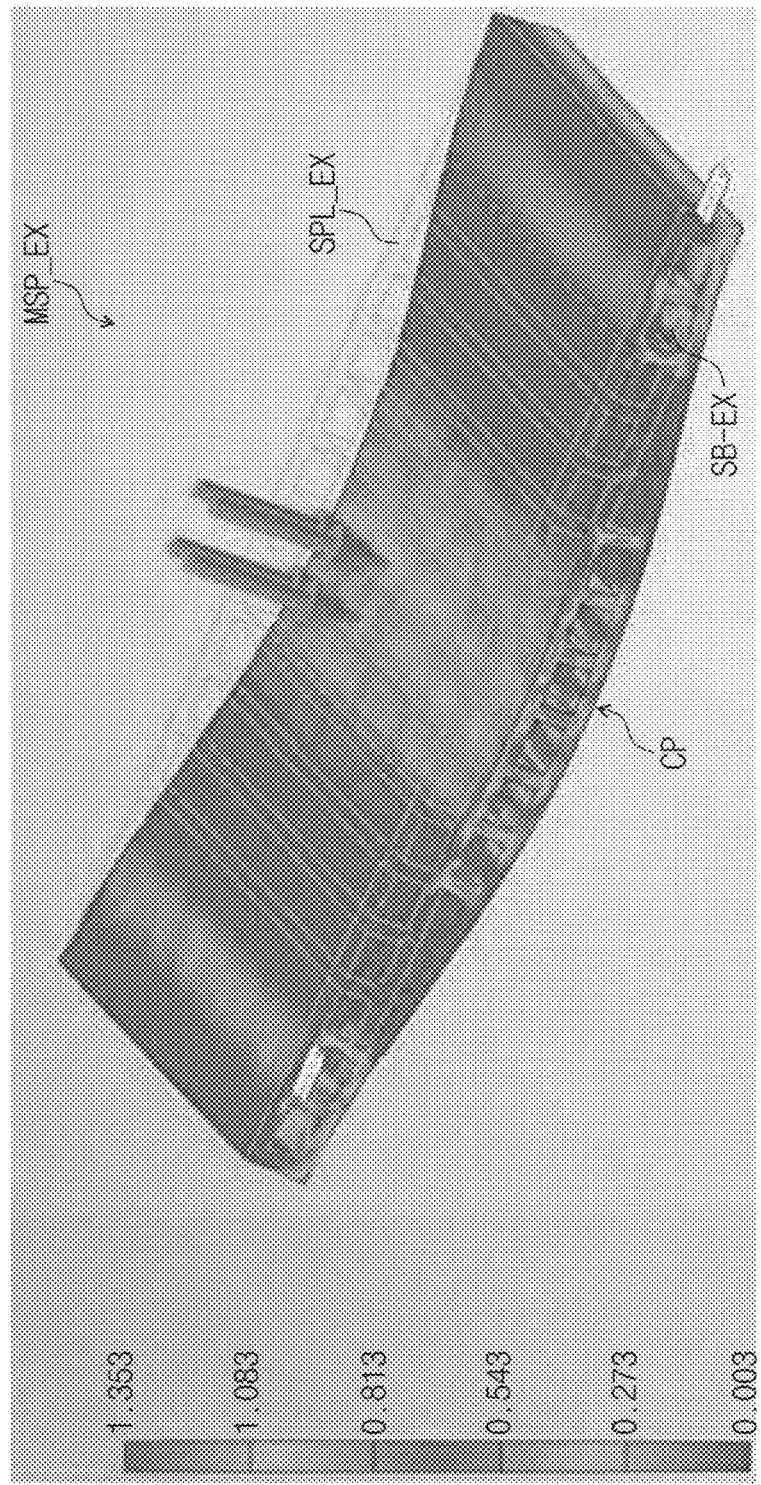
FIG. 13A is a view showing the results of testing the strain of a comparative module support in which support bars have the same width.
Figure 13B:
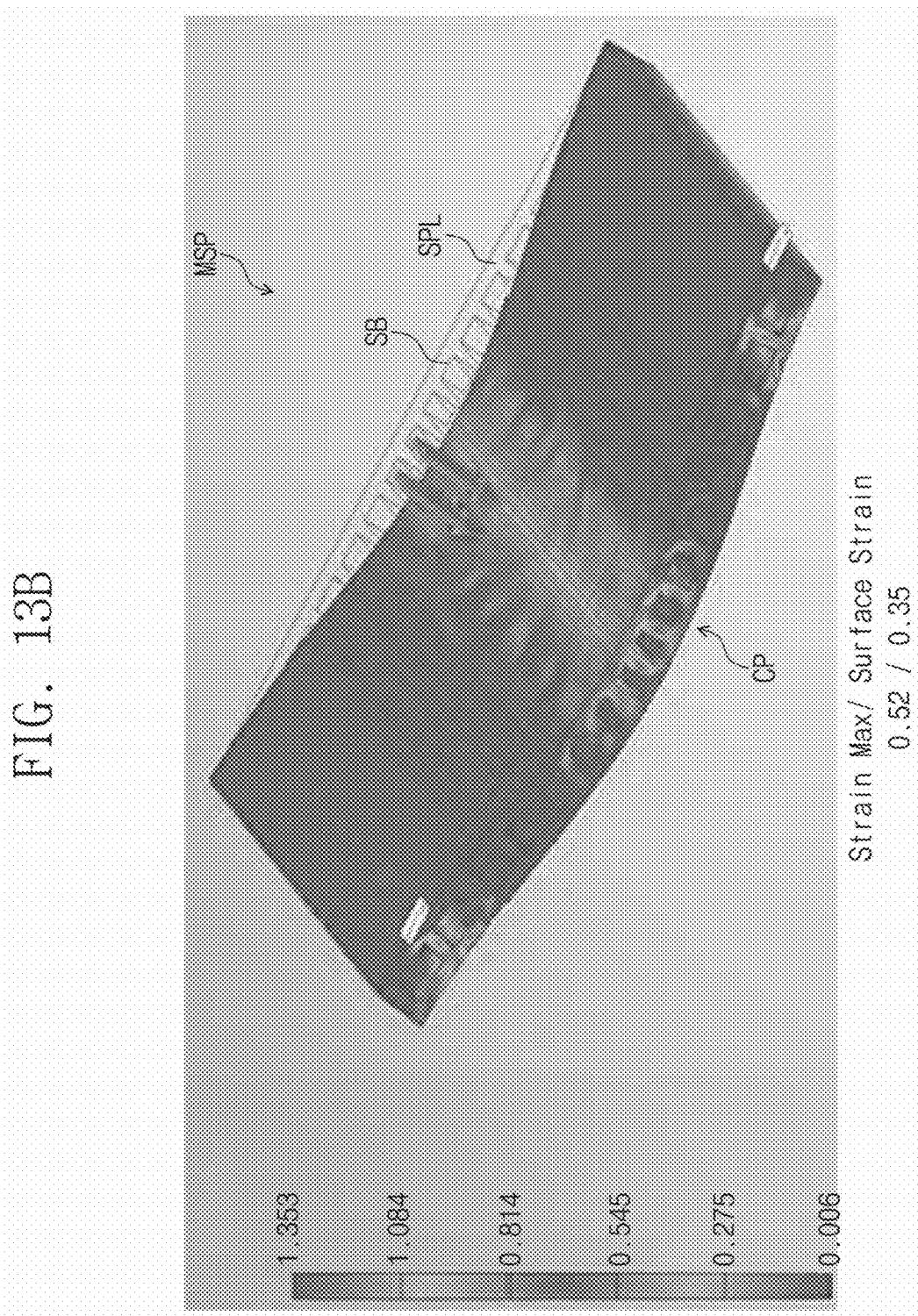
FIG. 13B is a view showing the results of testing the strain of the module support illustrated in FIG. 7.
Figure 13C:
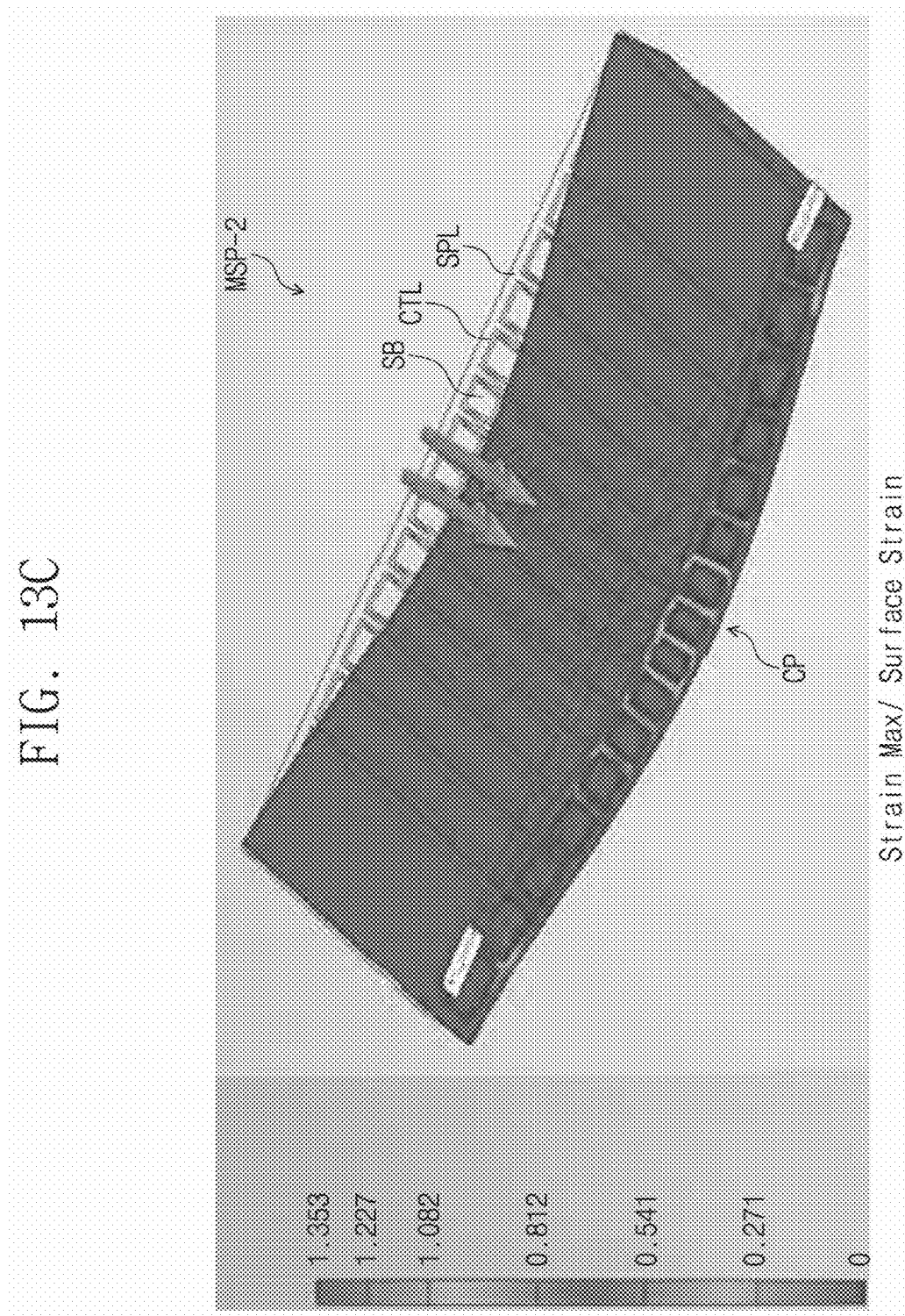
FIG. 13C is a view showing the results of testing the strain of the module support illustrated in FIG. 11.
Figure 14:
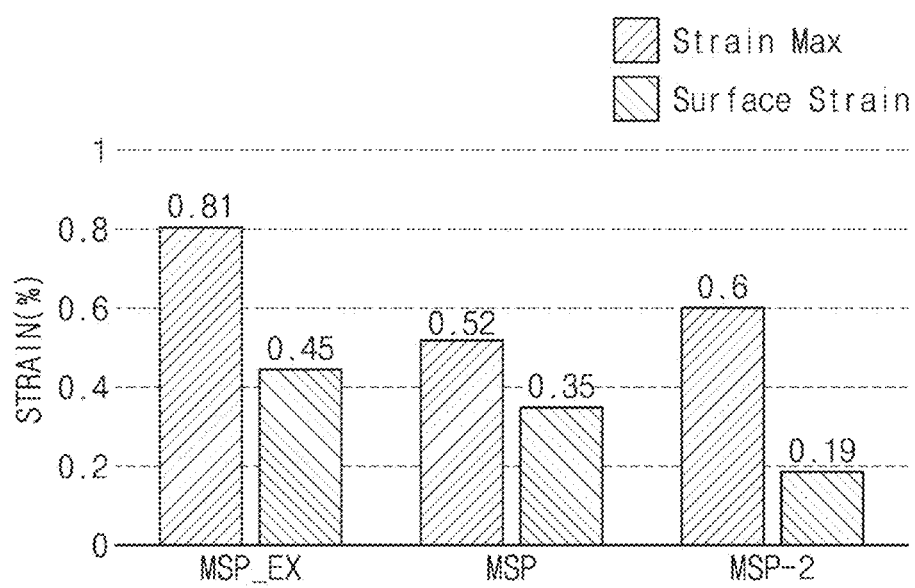
FIG. 14 is a graph showing the strains of the module supports of FIG. 13A, FIG. 13B, and FIG. 13C.

FIG. 13A is a view showing the results of testing the strain of a comparative module support in which support bars have a same width as each other. FIG. 13B is a view showing the results of testing the strain of the module support illustrated in FIG. 7. FIG. 13C is a view showing the results of testing the strain of the module support illustrated in FIG. 11. FIG. 14 is a graph showing the strains of the module supports of FIG. 13A, FIG. 13B, and FIG. 13C.

In FIG. 13A, FIG. 13B, FIG. 13C, and FIG. 14, strains of module supports MSP_EX, MSP, and MSP-2 represent test results for central portions CP of support layers SPL of the module supports MSP_EX, MSP, and MSP-2. The Stain Max represents the strain of a portion of a support layer SPL in contact with a first support bar SB1 in a central portion CP, and the surface strain represents the strain of an upper surface of the central portion CP. Strain represents a value expressed as a ratio of a length increased or decreased with respect to the original length when an object is stretched or compressed. Referring to FIG. 13A and FIG. 14, the strain of the support layer SPL_EX including the support bars SB_EX is illustrated in grayscale. The strain may be larger as being lighter in grayscale, and smaller as being darker in grayscale.

The module support MSP_EX may be bent based on the central portion CP for a rolling operation. The support bars SB_EX may have a same width as each other. The support layer SPL_EX between the support bars SB_EX may have different strains depending on the distance of points therein from the central portion CP. The maximum strain of the support layer SPL_EX of the central portion CP may be about 0.81%, and the surface strain thereof may be about 0.45%.

Referring to FIG. 13A and FIG. 14, the strain of the support layer SPL of the module support MSP is illustrated in grayscale. The strain may be larger as being lighter in grayscale, and smaller as being darker in grayscale.

As described above, the support bars SB may have different widths from each other. A support bar SB of the central portion CP may have the smallest width, and widths of the support bars SB may gradually increase as being away from the central portion.

The module support MSP may be bent based on the central portion CP for a rolling operation. The support layer SPL between the support bars SB may have different strains depending on the distance of points therein from the central portion CP. The maximum strain of the support layer SPL of the central portion CP may be about 0.52%, and the surface strain thereof may be about 0.35%.

Referring to FIG. 13A and FIG. 14, the strain of the support layer SPL of the module support MSP-2 is illustrated in grayscale. The strain may be larger as being lighter in grayscale, and smaller as being darker in grayscale.

A support bar SB of the central portion CP may have the smallest width, and widths of the support bars SB may gradually increase as being away from the central portion. The coating layers CTL may respectively surround the support bars SB.

The module support MSP-2 may be bent based on the central portion CP for a rolling operation. The support layer SPL between the support bars SB may have different strains depending on the distance of points therein from the central portion CP. The maximum strain of the support layer SPL of the central portion CP may be about 0.60%, and the surface strain thereof may be about 0.19%.

Referring to FIG. 14, the maximum strains and surface strains of the module supports MSP and MSP-2 may be less than the maximum strain and surface strain of the module support MSP_EX. It is shown that the central portion CP of the support layer SPL on which a support bar SB having the minimum width has a smaller strain than the central portion CP of the support layer SPL_EX on which the support bars SB-EX are disposed.

In an embodiment of the invention, as the maximum strain and surface strain are small, stress of the module supports MSP and MSP-2 on the display module DM may be reduced.

Figure 15:
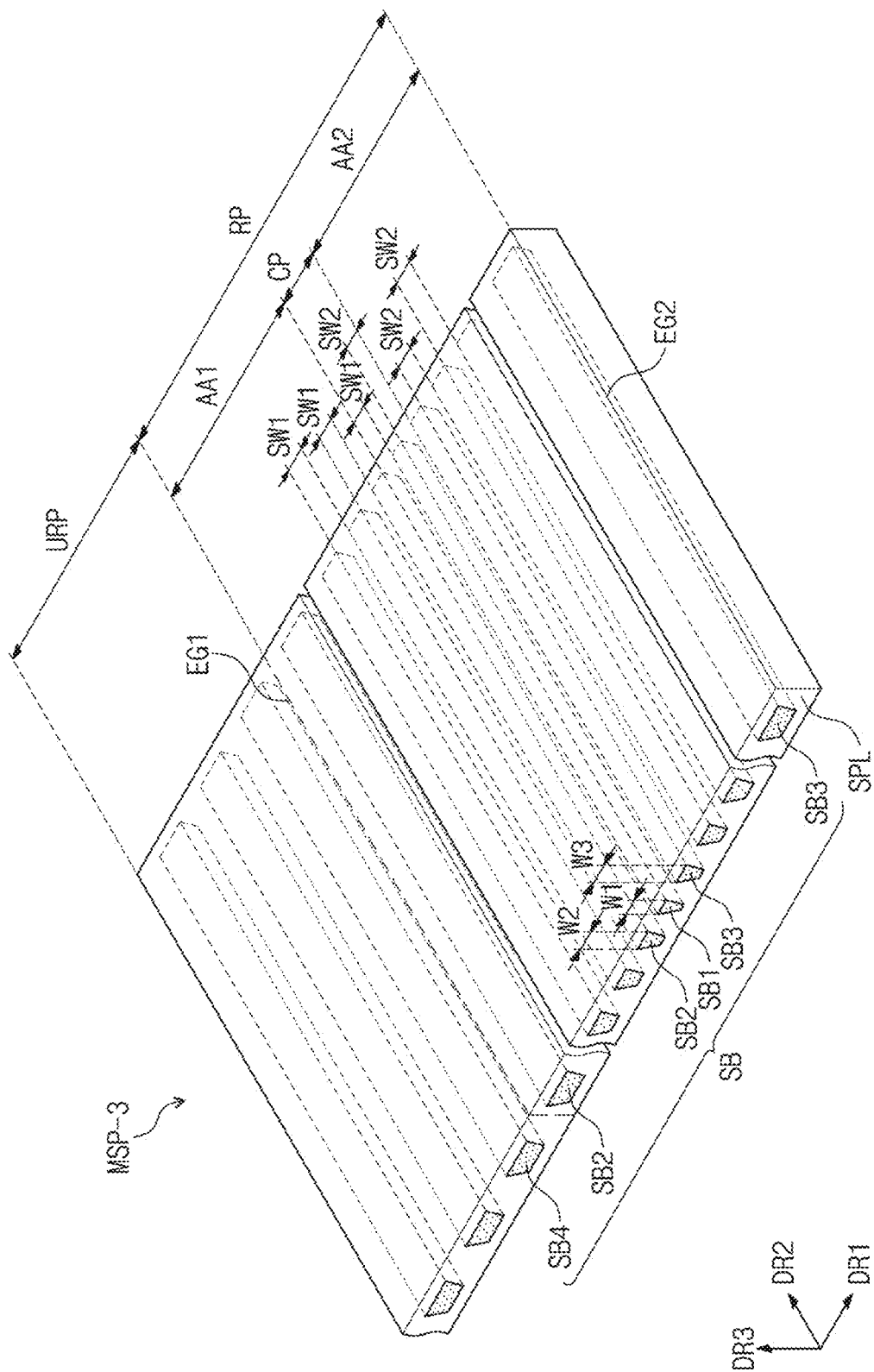
FIG. 15 is a view illustrating a module support according to an alternative embodiment of the invention.

FIG. 15 is a view illustrating a module support according to an alternative embodiment of the invention.

Referring to FIG. 15, an alternative embodiment of a module support MSP-3 may have the same configuration as that of the embodiment of the module support MSP described above with reference to FIG. 7 except for intervals between support bars SB. Hereinafter, for convenience of description, the same or like elements shown in FIG. 15 have been labeled with the same reference characters as used above to describe the embodiment of the module support shown in FIG. 7, and any repetitive detailed description thereof will hereinafter be omitted or simplified.

In an embodiment, as shown in FIG. 15, the support bars SB of the module support MSP-3 may include first, second, and third support bars SB1, SB2, and SB3 disposed in a central portion CP and in first and second regions AA1 and AA2. Intervals between the first and second support bars SB1 and SB2 and between adjacent second support bars SB2 in the first region AA1 may be defined as first intervals SW1. Intervals between the first and third support bars SB1 and SB3 and between adjacent third support bars SB3 in the second region AA2 may be defined as second intervals SW2.

The first intervals SW1 between the first and second support bars SB1 and SB2 and between adjacent second support bars SB2 in the first region AA1 may be different from each other. In addition, the second intervals SW2 between the first and third support bars SB1 and SB3 and between adjacent third support bars SB3 in the second region AA2 may be different from each other.

The first intervals SW1 between the first and second support bars SB1 and SB2 and between adjacent second support bars SB2 in the first region AA1 may gradually increase as being closer to a first edge EG1. The second intervals SW2 between the first and third support bars SB1 and SB3 and between adjacent third support bars SB3 in the second region AA2 may gradually increase as being closer to a second edge EG2. The first intervals SW1 and the second intervals SW2 may be symmetrical to each other with respect to the central portion CP.

Figure 16:
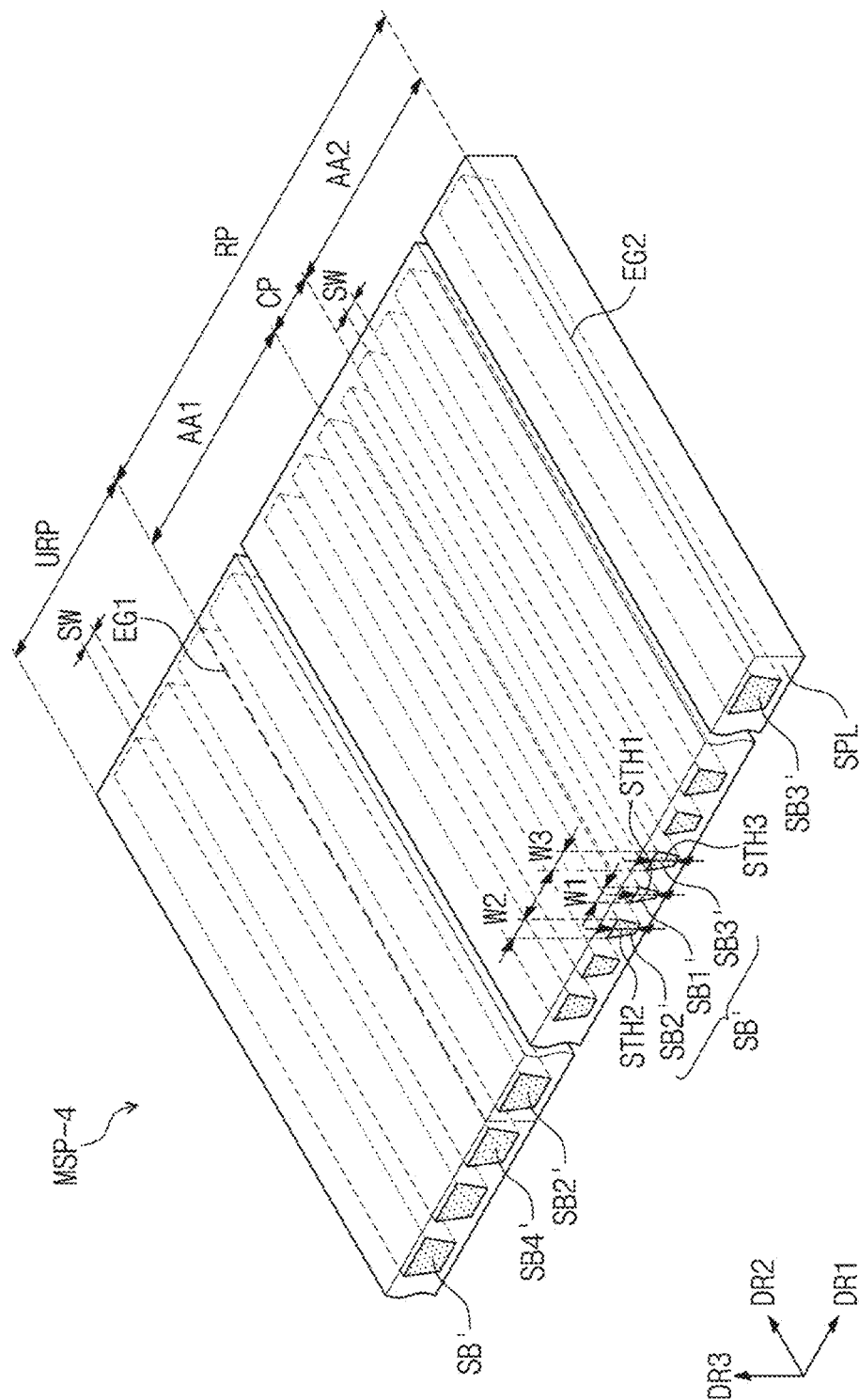
FIG. 16 is a view illustrating a module support according to another alternative embodiment of the invention.

FIG. 16 is a view illustrating a module support according to another alternative embodiment of the invention.

Referring to FIG. 16, another alternative embodiment of a module support MSP-4 may have the same configuration as that of the embodiment of the module support MSP described above with reference to FIG. 7 except for thicknesses of support bars SB. Hereinafter, for convenience of description, the same or like elements shown in FIG. 16 have been labeled with the same reference characters as used above to describe the embodiment of the module support shown in FIG. 7, and any repetitive detailed description thereof will hereinafter be omitted or simplified.

In an embodiment, as shown in FIG. 16, the module support MSP-4 may include a support layer SPL and a plurality of support bars SB'. The support bars SB' may include a first support bar SB1' disposed in a central portion CP, a plurality of second support bars SB2' disposed in a first region AA1, a plurality of third support bars SB3' disposed in a second region AA2, and a plurality of fourth support bars SB4' disposed in an unrolling portion URP.

The first support bar SB1' may have the smallest thickness among the support bars SB'. The second support bars SB2' may have a second thickness STH2 which is greater than the first thickness STH1. The second support bars SB2' may have different thicknesses from each other. In an embodiment, for example, the second thicknesses STH2 of the second support bars SB2' may gradually increase as being closer to a first edge EG1.

The third support bars SB3' may have a third thickness STH3 which is greater than the first thickness STH1. The third support bars SB3' may have different thicknesses from each other. In an embodiment, for example, the third thicknesses STH3 of the third support bars SB3' may gradually increase closer to a second edge EG2. The second thicknesses STH2 and the third thicknesses STH3 may be symmetrical to each other with respect to the central portion CP. Thicknesses of the fourth support bars SB4' may be the same as the width of a second support bar SB2' adjacent to the first edge EG1 or the width of a third support bar SB3' adjacent to the second edge EG2.

Figure 17:
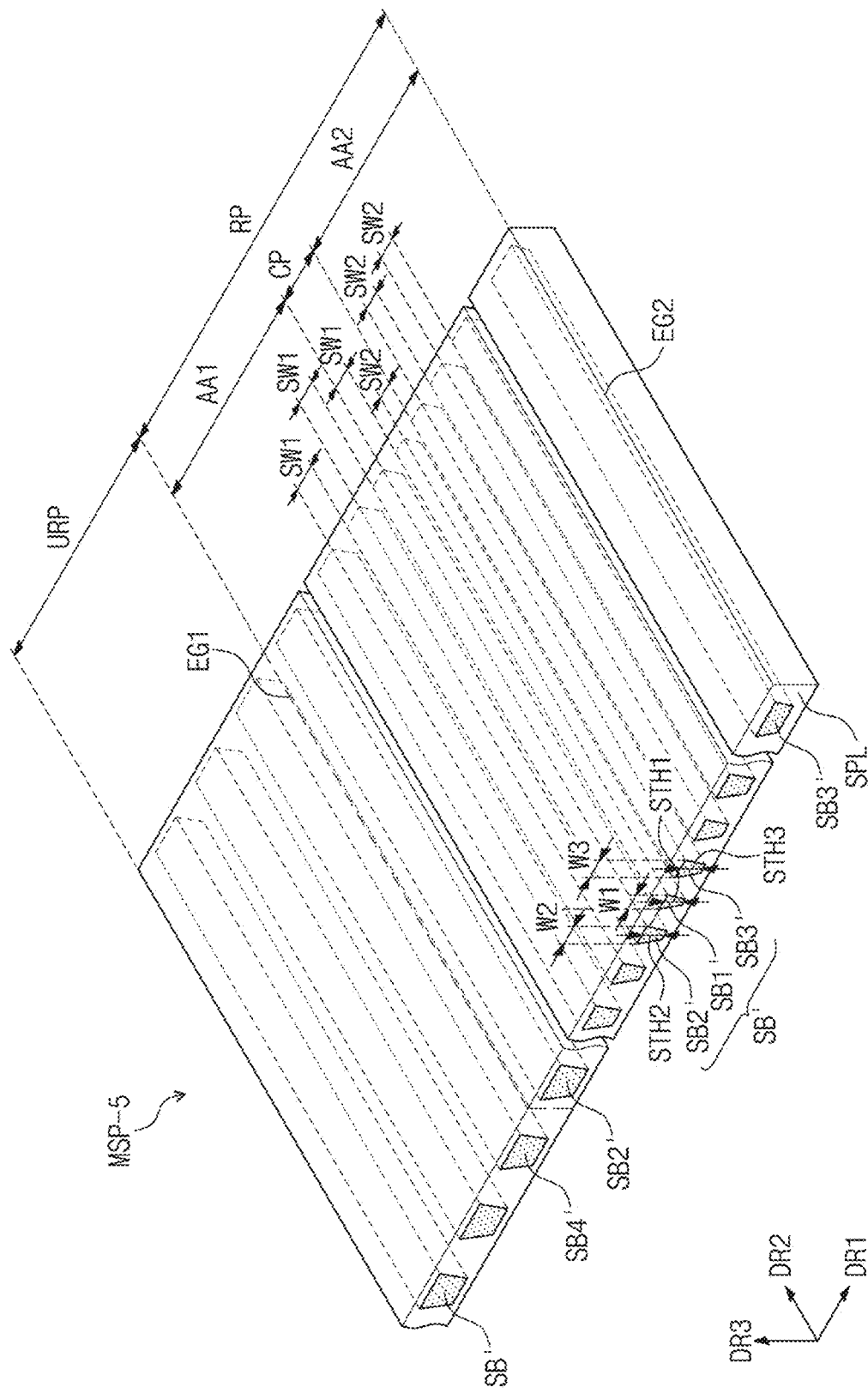
FIG. 17 is a view illustrating a module support according to another alternative embodiment of the invention.

FIG. 17 is a view illustrating a module support according to another alternative embodiment of the invention.

Referring to FIG. 17, another alternative embodiment of a module support MSP-5 may have the same configuration as that of the embodiment of the module support MSP described above with reference to FIG. 7 except for distances between support bars SB' and thicknesses of the support bars SB. Hereinafter, for convenience of description, the same or like elements shown in FIG. 17 have been labeled with the same reference characters as used above to describe the embodiment of the module support shown in FIG. 7, and any repetitive detailed description thereof will hereinafter be omitted or simplified.

In an embodiment, as shown in FIG. 17, the support bars SB' of the module support MSP-5 may include first, second, and third support bars SB1, SB2, and SB3 disposed in a central portion CP and in first and second regions AA1 and AA2. The first intervals SW1 between the first and second support bars SB1' and between adjacent second support bars SB2' in the first region AA1 may gradually increase as being closer to a first edge EG1. The second intervals SW2 between the first and third support bars SB1' and SB3' and between adjacent third support bars SB3' in the first region AA1 may gradually increase as being closer to a second edge EG2.

The first support bar SB1' may have a first thickness STH1. The second support bars SB2' may have a second thickness STH2 which is greater than the first thickness STH1. The second thicknesses STH2 of the second support bars SB2' may gradually increase as being closer to the first edge EG1. The third support bars SB3' may have a third thickness STH3 which is greater than the first thickness STH1. In an embodiment, for example, the third thicknesses STH3 of the third support bars SB3' may gradually increase as being closer to the second edge EG2.

According to embodiments of the invention, the strain and support properties of a module support may be effectively set or optimized according to the positions of portions of a display module having different strains. Therefore, in a portion in which the strain of the display module is high, the strain of the module support may be decreased to prevent buckling, and in a portion in which the strain of the display module is low, the support force of the module support may be increased to improve the surface quality of the display module.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display module including a display panel and a window disposed on the display panel;
a support layer disposed below the display panel and the window of the display module, wherein the support layer includes a rolling portion wound and unwound in a first direction, wherein the rolling portion includes a central portion, a first region between a first edge of the rolling portion and the central portion, and a second region between a second edge of the rolling portion, which is opposite to the first edge in the first direction, and the central portion;
a first support bar disposed inside the support layer in the central portion;
a plurality of second support bars disposed inside the support layer in the first region; and
a plurality of third support bars disposed inside the support layer in the second region,
wherein a width of each of the plurality of second support bars in the first direction is greater than a width of the first support bar, and
widths of the plurality of second support bars in the first direction gradually increase as being closer to the first edge, and
wherein the first, second, and third support bars are disposed between an upper surface of the support layer and a lower surface of the support layer.
2. The display device of claim 1, wherein
a width of each of the plurality of third support bars in the first direction is greater than the width of the first support bar, and widths of the plurality of third support bars in the first direction gradually increase as being closer to the second edge.

3. The display device of claim 1, wherein
each of the plurality of first, second, and third support bars extends in a second direction crossing the first direction, and
the plurality of first, second, and third support bars are arranged at constant intervals in the first direction.

4. The display device of claim 3, wherein opposing ends of the plurality of first, second, and third support bars, which are opposite to each other in the second direction, are exposed to an outside of the support layer.

5. The display device of claim 1, wherein the widths of the plurality of second support bars and the widths of the plurality of third support bars are symmetrical to each other with respect to the central portion.

6. The display device of claim 1, wherein thicknesses of the plurality of first, second, and third support bars in a direction perpendicular to the first direction and a second direction crossing the first direction are the same as each other.

7. The display device of claim 1, wherein each of the plurality of first, second, and third support bars has a Young's modulus greater than a Young's modulus of the support layer.

8. The display device of claim 1, further comprising:
an unrolling portion extending from the first edge in the first direction, wherein the unrolling portions is maintained in a flat state; and
a plurality of fourth support bars disposed inside the support layer in the unrolling portion.

9. The display device of claim 8, wherein a width of each of the plurality of fourth support bars in the first direction are the same as a width of a second support bar adjacent to the first edge among the plurality of second support bars.

10. The display device of claim 8, wherein the plurality of first, second, third, and fourth support bars are arranged at constant intervals in the first direction.

11. The display device of claim 1, wherein a number of the plurality of second support bars is the same as a number of the plurality of third support bars.

12. The display device of claim 1, wherein
intervals between the plurality of second support bars gradually increase as being closer to the first edge, and
intervals between the plurality of third support bars gradually increase as being close to the second edge.

13. The display device of claim 1, wherein
a thickness of each of the plurality of second support bars is greater than a thickness of the first support bar,
thicknesses of the plurality of second support bars gradually increase as being closer to the first edge,
a thickness of each of the plurality of third support bars is greater than the thickness of the first support bar, and
thicknesses of the plurality of third support bars gradually increase as being closer to the second edge.

14. The display device of claim 1, wherein when viewed in a second direction crossing the first direction, each of the plurality of first, second, and third support bars has an inverted trapezoidal shape.

15. The display device of claim 1, wherein
intervals between the plurality of second support bars gradually increase as being closer to the first edge,
intervals between the plurality of third support bars gradually increase as being close to the second edge;
a thickness of each of the plurality of second support bars is greater than a thickness of the first support bar, thicknesses of the plurality of second support bars gradually increase as being closer to the first edge,
a thickness of each of the plurality of third support bars is greater than the thickness of the first support bar, and
thicknesses of the plurality of third support bars gradually increase as being closer to the second edge.

16. The display device of claim 1, further comprising:
a coating layer disposed inside the support layer in the support layer, and surrounding each of the plurality of first, second, and third support bars,
wherein a Young's modulus of the support layer is less than a Young's modulus of the support bars, and
a Young's modulus of the coating layer is greater than the Young's modulus of the support layer and less than the Young's modulus of the support bars.

17. A display device comprising:
a display module including a display panel and a window disposed on the display panel;
a support layer disposed below the display panel and the window of the display module, wherein the support layer includes a rolling portion wound and unwound in a first direction; and
a plurality of support bars disposed inside the support layer in the support layer, wherein each of the plurality of support bars extends in a second direction crossing the first direction, and the plurality of support bars is arranged in the first direction,
wherein widths of the plurality of support bars in the first direction gradually increase from one point of the rolling portion toward opposing ends of the rolling portion opposite to each other in the first direction, and the plurality of support bars is arranged at constant intervals in the first direction.

18. The display device of claim 17, wherein the one point of the rolling portion is defined as a central portion of the rolling portion with respect to the first direction.

19. The display device of claim 18, wherein
the rolling portion comprises:
a first region between a first edge at one end of the opposing ends of the rolling portion and the central portion; and
a second region between a second edge at the other end of the opposing ends of the rolling portion and the central portion, and
the plurality of support bars comprises:
a first support bar disposed inside the support layer in the central portion;
a plurality of second support bars disposed inside the support layer in the first region; and
a plurality of third support bars disposed inside the support layer in the second region,
wherein a width of each of the plurality of second support bars in the first direction is greater than a width of the first support bar,
widths of the plurality of second support bars in the first direction gradually increase as being closer to the first edge,
a width of each of the plurality of third support bars in the first direction is greater than the width of the first support bar, and
widths of the plurality of third support bars in the first direction gradually increase as being closer to the second edge.

20. An electronic device comprising:
a display device comprising:
a display module including a display panel and a window disposed on the display panel;

a support layer disposed below the display panel and the window of the display module, wherein the support layer includes a rolling portion wound and unwound in a first direction, wherein the rolling portion includes a central portion, a first region between a first edge of the rolling portion and the central portion, and a second region between a second edge of the rolling portion, which is opposite to the first edge in the first direction, and the central portion;

a first support bar disposed inside the support layer in the central portion;

a plurality of second support bars disposed inside the support layer in the first region; and a plurality of third support bars disposed inside the support layer in the second region, wherein a width of each of the plurality of second support bars in the first direction is greater than a width of the first support bar, and widths of the plurality of second support bars in the first direction gradually increase as being closer to the first edge, and wherein the first, second, and third support bars are disposed between an upper surface of the support layer and a lower surface of the support layer.

\* \* \* \* \*